(12) United States Patent
Cheng

(10) Patent No.: US 12,040,375 B2
(45) Date of Patent: Jul. 16, 2024

(54) MULTI-SILICIDE STRUCTURE FOR A SEMICONDUCTOR DEVICE AND A METHOD FOR MANUFACTURING THE SAME

(71) Applicant: Taiwan Semiconductor Manufacturing Company, Ltd., Hsinchu (TW)

(72) Inventor: Chung-Liang Cheng, Changhua (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 63 days.

(21) Appl. No.: 17/249,918

(22) Filed: Mar. 18, 2021

(65) Prior Publication Data
US 2022/0302278 A1    Sep. 22, 2022

(51) Int. Cl.
*H01L 29/66* (2006.01)
*H01L 21/3065* (2006.01)
*H01L 27/06* (2006.01)
*H01L 29/06* (2006.01)
*H01L 29/423* (2006.01)
(Continued)

(52) U.S. Cl.
CPC ...... *H01L 29/4933* (2013.01); *H01L 21/3065* (2013.01); *H01L 27/0688* (2013.01); *H01L 29/0669* (2013.01); *H01L 29/42392* (2013.01); *H01L 29/66795* (2013.01); *H01L 29/7845* (2013.01); *H01L 29/785* (2013.01); *H01L 2029/7858* (2013.01)

(58) Field of Classification Search
CPC ............ H01L 29/4933; H01L 21/3065; H01L 27/0688; H01L 29/0669; H01L 29/42392; H01L 29/66795; H01L 29/7845; H01L 29/785; H01L 2029/7858; H01L 21/28518; H01L 29/456; H01L 29/165; H01L 29/7848; H01L 29/775; H01L 21/32135; H01L 29/0673; H01L 29/401; H01L 29/41725; H01L 29/66439; H01L 21/76825; H01L 21/76846; H01L 21/76855; H01L 21/76879; H01L 29/41791; H01L 29/0665; H01L 29/665; B82Y 10/00
See application file for complete search history.

(56) References Cited

U.S. PATENT DOCUMENTS

| 8,728,885 | B1 | 5/2014 | Pham et al. |
| 9,748,352 | B2 | 8/2017 | Liu et al. |
| 10,211,307 | B2 | 2/2019 | Ching et al. |

(Continued)

*Primary Examiner* — Cuong B Nguyen
(74) *Attorney, Agent, or Firm* — Harrity & Harrity, LLP

(57) ABSTRACT

A semiconductor device includes a multi-silicide structure comprising at least two conformal silicide layers. The multi-silicide structure may include a first conformal silicide layer on a source/drain, a second conformal silicide layer on the first conformal silicide layer, and a capping layer over the second conformal silicide layer. The semiconductor device includes a contact structure on the multi-silicide structure. The semiconductor device includes a dielectric material around the contact structure. In some implementations, a controller may determine etch process parameters to be used by an etch tool to perform an iteration of an atomic layer etch (ALE) process on the semiconductor device.

20 Claims, 20 Drawing Sheets

(51) Int. Cl.
 *H01L 29/49* (2006.01)
 *H01L 29/78* (2006.01)

(56) References Cited

U.S. PATENT DOCUMENTS

| | | | | |
|---|---|---|---|---|
| 2006/0267087 A1* | 11/2006 | Chiu | ............ | H01L 29/7833 |
| | | | | 257/E21.438 |
| 2013/0062624 A1* | 3/2013 | Tsuchiya | ............ | H01L 29/861 |
| | | | | 257/E21.409 |
| 2017/0117379 A1* | 4/2017 | Chen | ............ | H01L 29/45 |
| 2017/0358663 A1* | 12/2017 | Li | ............ | H01L 21/02694 |
| 2022/0199798 A1* | 6/2022 | Kang | ............ | H01L 29/66439 |

* cited by examiner

MULTI-SILICIDE STRUCTURE FOR A SEMICONDUCTOR DEVICE AND A METHOD FOR MANUFACTURING THE SAME

BACKGROUND

A contact silicide can be used to facilitate contact to a source, drain, or gate of a semiconductor device. For example, a contact silicide can be formed on a source, a drain, or a gate of a metal-oxide-semiconductor field-effect-transistor (MOSFET) structure to facilitate contact to the source, the drain, or the gate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
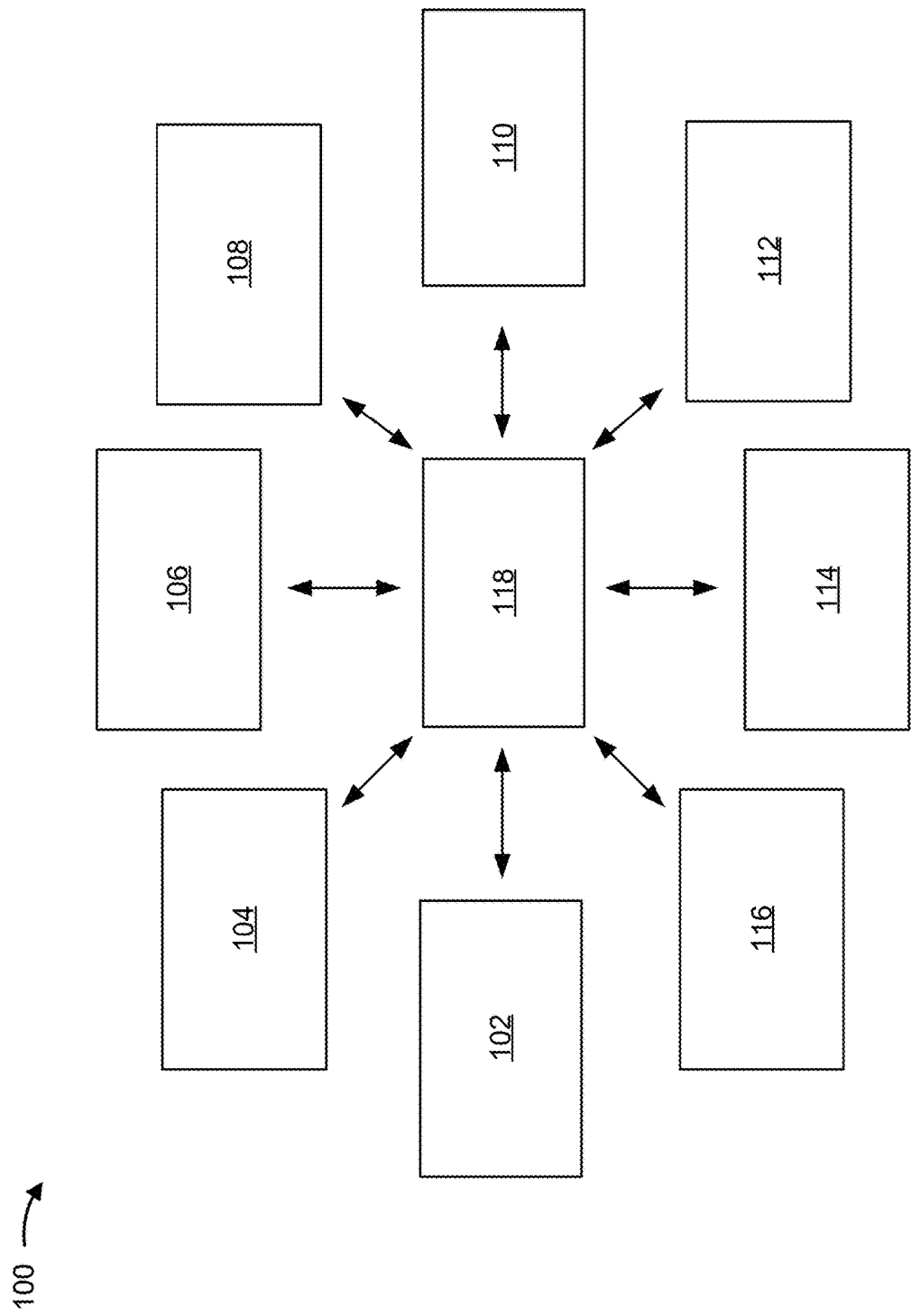
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a MOSFET may have a three-dimensional (3D) gate-all-around (GAA). Such a device is herein referred to as a 3D GAA FET. The 3D GAA FET structure utilizes nanowires or stacked nanosheets that are aligned (parallel or perpendicular) to a substrate. The 3D GAA FET structure allows the 3D GAA FET to achieve improved performance and reduced off-current as compared to other MOSFET structures (e.g., a planar MOSFET structure or a FinFET structure, among other examples). Further, the 3D GAA FET can include a contact silicide (e.g., a middle-end-of-line (MEOL) contact silicide) over a source, a drain, or a gate. This contact silicide includes a single silicide layer, such as a single Ti silicide layer with a thickness in a range from approximately 10 angstroms (Å) to approximately 40 Å, and a capping layer, such as a titanium nitride (TiN) capping layer.

However, in a 3D GAA FET, the contact silicide can suffer from non-conformal formation. For example, the single silicide layer is formed using a non-conformal process, such as a physical vapor deposition (PVD) process. The resulting non-conformality of the contact silicide is particularly significant when formed on a surface with 3D features, such as those present in a 3D GAA FET. As a result, coverage of the single silicide layer in the contact silicide may be insufficient, which can result in high contact resistance in the 3D GAA FET, thereby degrading performance of the 3D GAA FET and/or reducing manufacturing yield for 3D GAA FETs.

Some implementations described herein provide a semiconductor device including a multi-silicide structure. In some implementations, the semiconductor device may be a 3D GAA FET. In some implementations, the multi-silicide structure includes at least two conformal silicide layers. For example, the multi-silicide structure may include a first conformal silicide layer on a source/drain layer of the semiconductor device and a second conformal silicide layer on the first conformal silicide layer. In some implementations, the multi-silicide structure includes a capping layer over the second conformal silicide layer. Additional details regarding the multi-silicide structure, and the formation thereof, are provided below.

In some implementations, the multi-silicide structure described herein increases a thickness of the contact silicide (e.g., as compared to a contact silicide including a single, non-conformal silicide layer as described above). Further, the multi-silicide structure described herein may be formed to include conformal silicide layers. The increased thickness and the conformal nature of the multi-silicide structure reduces contact resistance in the semiconductor device, thereby improving performance and increasing manufacturing yield.

Further, some implementations described herein provide techniques and apparatuses for dynamic adjustment of etch process parameters to be used for performing an iteration of an etch process (e.g., an atomic layer etch (ALE) process). For example, in some implementations, the etch process parameters to be used by an etch tool to perform an iteration of an etch process (e.g., during formation of the multi-silicide structure described herein) may be dynamically adjusted using an analysis model (e.g., a model trained to determine a set of adjusted etch process parameters). In some implementations, characteristics of an etch resulting from the iteration of the etch process performed using the adjusted etch process parameters may be used to update the analysis model. In some implementations, the analysis model may enable cycle-to-cycle or run-to-run adjustment of etch process parameters. Additional details are provided below.

In some implementations, the dynamic adjustment of the etch process parameters enables etching with improved reliability. That is, the dynamic adjustment of the etch process parameters may enable etching that reliably matches target specifications, thereby enabling reliable performance of semiconductor devices and improving manufacturing yield.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, an ion implantation tool 112, a thermal processing tool 114, a pre-cleaning tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing or otherwise growing various types of materials. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes a tool capable of facilitating growth a material using a soaking process (e.g., a silane soaking process, a disilane soaking process). In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, an atomic layer etch (ALE) and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The ion implantation tool 112 is a semiconductor processing tool that is capable of implanting ions into one or more layers of a wafer or semiconductor device. The ion implantation tool 112 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the wafer or semiconductor device such that the ions are implanted below the surface of the wafer or semiconductor device.

The thermal processing tool 114 is a semiconductor processing tool that is capable of heating a wafer or semiconductor device in order to affect electrical properties of the wafer or semiconductor device. For example, the thermal processing tool 114 may heat the wafer or semiconductor device to activate dopants, change film-to-film or film-to-wafer interfaces, densify deposited films, change states of grown films, repair damage from ion implantation, or move dopants or drive dopants from one film into another or from a film into the semiconductor device, among other examples. In some implementations, the thermal processing tool 114 may be capable of performing rapid thermal processing (RTP) (e.g., rapid thermal annealing (RTA)) in which the wafer or semiconductor device is heated to a high temperature (e.g., over 1000 degrees Celsius (° C.)) on a short timescale (e.g., several seconds or less). Using such a technique, the wafer or semiconductor device can be processed in a short time (e.g., several minutes). The thermal processing tool 114 may generate heat for heating the wafer or semiconductor device using, for example, a high intensity lamp, a laser, a hot chuck, or a hot plate, among other examples.

The pre-cleaning tool 116 is a semiconductor processing tool that is capable of performing a pre-cleaning process on a wafer or semiconductor device to remove one or more elements from the wafer or semiconductor device. In some implementations, the pre-cleaning tool 116 may perform the pre-cleaning process to prepare the wafer or semiconductor device for another semiconductor process step (e.g., to performed by another semiconductor processing tool). For example, the pre-cleaning tool 116 may perform the pre-cleaning process prior to removing a native oxide from a surface of the wafer or semiconductor device prior to one or more high-temperature processing steps (e.g., oxidation, diffusion, or CVD, among other examples) being performed on the wafer or semiconductor device.

Wafer/die transport tool 118 includes a mobile robot, a robot arm, a tram or rail car, an overhead hoist transport (OHT) system, an automated materially handling system (AMHS), and/or another type of device that is used to transport wafers and/or dies between semiconductor processing tools 102-116 and/or to and from other locations such as a wafer rack, a storage room, and/or the like. In some implementations, wafer/die transport tool 118 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
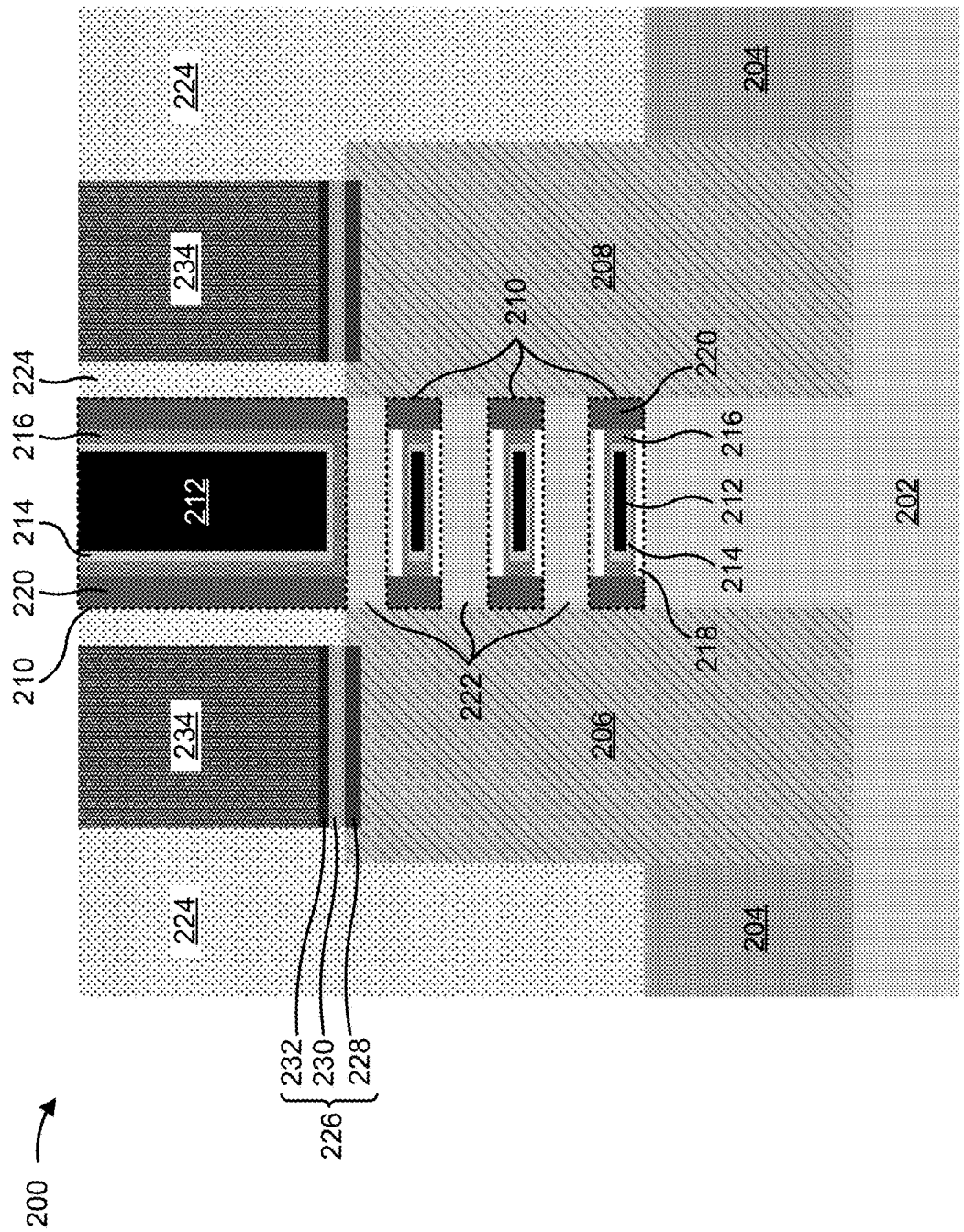
FIG. 2 is a diagram of an example semiconductor device described herein.

FIG. 2 is a diagram of an example semiconductor device 200 described herein. As shown in FIG. 2A, the semiconductor device 200 may include a substrate 202, a shallow trench isolation (STI) layer 204, a source 206, a drain 208, a gate structure 210, a group of channel structures 222, a dielectric material 224, a multi-silicide structure 226, and a contact structure 234. The semiconductor device 200 shown in FIG. 2 is an example of a 3D GAA FET, and the cross-section shown in FIG. 2 is a cross-section perpendicular to the gate structure 210. Notably, while the example implementations described herein are described with reference to the example 3D GAA FET structure shown in FIG. 2, the semiconductor device 200 may, in practice, be a type of semiconductor device other than a 3D GAA FET, may include one or more other and/or different semiconductor layers, and/or may have a different structure than shown in FIG. 2.

The substrate 202 may include a semiconductor die substrate, a semiconductor wafer, or another type of substrate in which the semiconductor device 200 may be formed. In some implementations, the substrate 202 is formed of silicon, a material including silicon, a III-V compound semiconductor material such as gallium arsenide (GaAs), a silicon on insulator (SOI), or another type of semiconductor material.

The STI layer 204 may include a layer to reduce or prevent electric current leakage between adjacent components of the semiconductor device 200. In some implementations, the STI layer 204 may include, for example, silicon dioxide ($SiO_2$), silicon nitride (SiN), and/or another type of dielectric material. In some implementations, the source 206 and the drain 208 are adjacent to (or over) the STI layer 204 within substrate 202. In some implementations, such as when the 3D GAA FET is a p-type MOSFET (pMOS), the source 206 and the drain 208 are formed from silicon germanium (SiGe) and, optionally, are doped with Boron (B). Alternatively, in some implementations, such as when the 3D GAA FET is an n-type MOSFET (nMOS), the source 206 and the drain 208 are formed from silicon phosphide (SiP) and, optionally, are doped with carbon (C).

As shown in FIG. 2, the gate structure 210 may include a gate metal 212, a work function metal layer 214, a high-K dielectric layer 216, an interfacial layer 218, and a low-K spacer layer 220.

The gate structure 210 comprises a gate metal 212 surrounded by a work function metal layer 214. The gate metal 212 may include, for example, Tungsten (W), aluminum (Al), copper (Cu), titanium (Ti), tantalum (Ta), and/or another conductive material. The work function metal layer 214 may include, for example, TiN (e.g., in the case of a pMOS 3D GAA FET), titanium aluminum carbide (TiAlC) (e.g., in the case of an nMOS 3D GAA FET), and/or another type of a material with a work function that satisfies a threshold requirement (e.g., a material with a work function that is greater than or equal to 4.7 electronvolts (eV)).

As further shown, the high-K dielectric layer 216 surrounds the work function metal layer 214. The high-K dielectric layer 216 may include, for example, a material with a dielectric constant that satisfies a threshold requirement (e.g., a material having a dielectric constant of at least 3.9, a dielectric constant greater than that of $SiO_2$, among other examples). In some implementations, the high-K dielectric layer 216 may include hafnium oxide ($HfO_2$) hafnium silicate (HfSiO4), zirconium silicate (ZrSiO4), and/or another type of high-K dielectric material.

As further shown, the interfacial layer 218 is above and/or below some portions of the gate structure 210. For example, the interfacial layer 218 may be above and below portions of the gate structure between the source 206 and the drain 208. The interfacial layer 218 include from, for example, from a silicon oxide (e.g., $SiO_2$), silicon nitride (e.g., SiN), and/or another type of dielectric material.

As further shown, the low-K spacer layer 220 may be formed adjacent to (e.g., to the left and the right of) other layers of the gate structure 210. The low-K spacer layer 220 may include an insulating material, such as a silicon nitride (SiN), silicon carbon nitride (SiCN), silicon oxynitride (SiON), silicon carbon oxynitride (SiCON), another material with a dielectric constant that is lower than a threshold requirement (e.g., a material having a dielectric constant of 3.9 or less, a dielectric constant less than or equal to that of $SiO_2$, and/or another type of material with a dielectric constant that is less than or equal to a threshold value, among other examples).

Notably, portions of a given layer of the gate structure 210 can be formed concurrently (e.g., through a single performance of one or more semiconductor fabrication processes) or can be formed at different times (e.g., through different performances of one or more semiconductor fabrication processes, or through different semiconductor fabrication processes).

As further shown, the group of channel structures 222 may be between the source 206 and the drain 208 (e.g., to enable current to flow between the source 206 and the drain 208). In some implementations, the group of channel structures 222 includes one or more so-called nanowires or nanosheets. In some implementations, the channel structures 222 can include, for example, Si, doped Si, silicon carbon (SiC), silicon germanium (SiGe), a III-V material, germanium (Ge), and/or another type of semiconductor material. In some implementations, each channel structure 222 is wrapped by the gate structure 210 (e.g., such that surfaces of the channel structure 222 other than those in contact with the source 206 and the drain 208 are in contact with some portion of the gate structure 210).

The dielectric material 224 is a dielectric material that provides isolation for other components of the semiconductor device 200. For example, the dielectric material 224 may comprise an interlayer dielectric (ILD) that provides electrical isolation between metal layers of the semiconductor device 200, between conductive layers of the semiconductor device 200, or between adjacent semiconductor devices 200. In some implementations, the dielectric material 224 is around the contact structure 234 (e.g., to provide isolation for the contact structure 234). In some implementations, the dielectric material 224 may include a low-K (e.g., a material having a dielectric constant of 3.9 or less, a material having a dielectric constant that is less than that of $SiO_2$, among other examples). Examples of materials that may be used for the dielectric material 224 include $SiO_2$, fluorine-doped $SiO_2$ (also referred to as fluorinated silica glass or fluorosilicate glass), or carbon-doped $SiO_2$ (also referred to as organosilicate glass).

In some implementations, the dielectric material 224 (e.g., a portion of the dielectric material 224 around the contact structure 234) is doped with an enhancement element. In some implementations, the enhancement element may seal the contact structure 234 within the dielectric material 224 in order to reduce or eliminate gaps between the dielectric material 224 and the contact structure 234, thereby improving isolation provided by the dielectric material 224 and/or contact provided by the contact structure 234 (e.g., as compared to the dielectric material 224 without doping by the enhancement element). In some implementations, the enhancement element may include, for example, germanium (Ge), tin (Sn), or another element having an atomic size that satisfies a threshold requirement (e.g., an element with an atomic size greater than that of Si). In some implementations, a material of the enhancement element may be selected to be larger than that of Si in order to enable gaps between the dielectric material 224 and the contact structure 234 to be reduced or minimized.

In some implementations, the multi-silicide structure 226 facilitates contact to the source 206 (e.g., through a contact structure 234 over the source 206) or to the drain 208 (e.g., through a contact structure 234 over the drain 208). In some implementations, a multi-silicide structure 226 is formed over the source 206, and a (separate) multi-silicide structure 226 is formed over the drain 208. Notably, two or more multi-silicide structures 226 of the semiconductor device 200 (e.g., a multi-silicide structure 226 over the source 206 and a multi-silicide structure 226 over the drain 208) can be formed concurrently (e.g., using the same sequence of semiconductor fabrication processes).

As shown in FIG. 2, the multi-silicide structure 226 includes at least a first conformal silicide layer 228 and a second conformal silicide layer 230, and a capping layer 232 (e.g., over the second conformal silicide layer 230, on a top-most conformal silicide layer of the multi-silicide structure 226).

In some implementations, a ratio of metal to silicon in the first conformal silicide layer 228 is greater than 1. However, other ratios of metal to silicon in the first conformal silicide layer 228 are within the scope of the present disclosure. A silicide in which a ratio of metal to silicon is greater than 1 can also be referred to as a metal-rich silicide. In some implementations, a ratio of metal to silicon in the second conformal silicide layer 230 may be less than 1. However, other ratios of metal to silicon in the second conformal silicide layer 230 are within the scope of the present disclosure. Therefore, in some implementations, the first conformal silicide layer 228 has a higher concentration of metal than the second conformal silicide layer 230. In some implementations, a ratio of silicon to metal in the second conformal silicide layer 230 is greater than 1. However, other ratios of silicon to metal in the second conformal silicide layer 230 are within the scope of the present disclosure. A silicide in which a ratio of silicon to metal is greater than 1 can also be referred to as a silicon-rich silicide. In some implementations, a ratio of silicon to metal in the first conformal silicide layer 228 may be less than 1. However, other ratios of silicon to metal in the first conformal silicide layer 228 are within the scope of the present disclosure. Therefore, in some implementations, the second conformal silicide layer 230 has a higher concentration of silicon than the first conformal silicide layer 228.

In some implementations, the first conformal silicide layer 228 is a metal-rich silicide and the second conformal silicide layer 230 is a silicon-rich silicide to enable the multi-silicide structure 226 to have a sufficient silicide thickness and to ensure that the silicide layers of the multi-silicide structure 226 are conformal silicide layers.

For example, in some implementations, the first conformal silicide layer 228 may be formed by depositing a metal, such as Ti, on a bottom surface of a recess over the source 206/drain 208 using a CVD process. Here, the Ti reacts with the Si in the source 206/drain 208 to form (e.g., grow) the first conformal silicide layer 228 (e.g., titanium silicide). The Ti CVD process is self-limiting, meaning that once the Si at the surface of the source 206/drain 208 is consumed by the reaction with the deposited Ti, the formation of the first conformal silicide layer 228 ceases. This self-limiting Ti CVD process therefore ensures conformal formation of the first conformal silicide layer 228. Further, the formation of the first conformal silicide layer 228 using the Ti CVD process results in the first conformal silicide layer 228 being Ti-rich. Additionally, a region of the first conformal silicide layer 228 near a top surface of the first conformal silicide layer 228 formed using the Ti CVD process comprises little or no Si. Thus, the Ti CVD process cannot be used to form another conformal Ti silicide layer on the first conformal silicide layer 228 (because there is insufficient Si at the top surface of the first conformal silicide layer 228 with which further deposited Ti can react to form conformal Ti silicide).

However, some inorganic compounds, such as silane ($SiH_4$) or disilane ($Si_2H_6$), react with Ti. In some implementations, silane may be used (e.g., rather than disilane) due to the comparatively higher reactivity of silane with Ti, which is desirable from the purposes of manufacturability. Thus, the second conformal silicide layer 230 may be formed by using a silane soaking process in which the top surface of the first conformal silicide layer 228 is soaked with silane. Here, the silane reacts with the Ti at the top surface of the first conformal silicide layer 228 to form (e.g., grow) the second conformal silicide layer 230 (e.g., titanium silicide). The silane soaking process is self-limiting, meaning that once the Ti at the top surface of the first conformal silicide layer 228 is consumed by the reaction with the silane, growth of the second conformal silicide layer 230 ceases. This self-limiting silane soaking process therefore ensures conformal formation of the second conformal silicide layer 230. Further, the formation of the second conformal silicide layer 230 using the silane soaking process results in the second conformal silicide layer 230 being Si-rich. Additionally, a region of the second conformal silicide layer 230 near a top surface of the second conformal silicide layer 230 formed using the silane soaking process comprises little or no Ti. Thus, the silane soaking process cannot be used to form another conformal Ti silicide layer on the second conformal silicide layer 230 (because there is insufficient Ti at the top surface of the second conformal silicide layer 230 with which further silane can react to form conformal Ti silicide).

This sequence of Ti CVD and silane soaking can be repeated to form additional conformal silicide layers in the multi-silicide structure 226 (e.g., when the multi-silicide structure 226 is to include more than two conformal silicide layers, an example of which is described below with respect to FIG. 4). In this way, the first conformal silicide layer 228 being a metal-rich silicide and the second conformal silicide layer 230 being a silicon-rich silicide enable the multi-silicide structure 226 to have a silicide thickness (e.g., by forming as many conformal silicide layers as needed to reach a desired thickness) that reduces contact resistance, while ensuring that the silicide layers of the multi-silicide structure 226 are conformal silicide layers.

In some implementations, a thickness of each of the at least two conformal silicide layers is in a range from approximately 5 Å to approximately 10 Å. However, other values for the thickness of each of the at least two conformal silicide layers are within the scope of the present disclosure. A thickness in the range from approximately 5 Å to approximately 10 Å enables each silicide layer of the multi-silicide structure 226 to be formed in a conformal manner. A thickness below approximately 5 Å may not enable the multi-silicide structure 226 to be formed with sufficient thickness so as to provide contact reduction in the semiconductor device 200. A thickness above approximately 10 Å may prevent a given silicide layer of the multi-silicide structure 226 from being a conformal silicide, thereby degrading performance of the semiconductor device 200.

In some implementations, a total thickness of the at least two conformal silicide layers (e.g., including the first conformal silicide layer 228 and the second conformal silicide layer 230) of the multi-silicide structure 226 is at least approximately 20 Å. However, other values for the total thickness of the at least two conformal silicide layers are within the scope of the present disclosure. For example, in some implementations, the thickness of the at least two conformal silicide layers (e.g., including the first conformal silicide layer 228 and the second conformal silicide layer 230) of the multi-silicide structure 226 is in a range from approximately 45 Å to approximately 50 Å. As noted above, other values for the thickness the total thickness of the at least two conformal silicide layers are within the scope of the present disclosure. In some implementations, a total thickness of at least approximately 20 Å enables contact resistance to be reduced in the semiconductor device 200 (e.g., as compared to a semiconductor device including a contact silicide with a single, non-conformal silicide layer). A total thickness below approximately 20 Å may not enable the multi-silicide structure 226 to provide contact reduction in the semiconductor device 200. A total thickness in the range from approximately 45 Å to approximately 50 Å may enable the multi-silicide structure 226 to provide desired contact reduction in the semiconductor device 200 without unnecessarily increasing complexity or cost of manufacturing the semiconductor device 200.

In some implementations, the at least two conformal silicide layers of the multi-silicide structure 226 comprise at least one of nickel silicide, cobalt silicide, titanium silicide, or tantalum silicide, and/or another type of silicide material. In some implementations, a type of silicide may be selected based on whether the semiconductor device 200 is a pMOS device or an nMOS device. For example, when the semiconductor device 200 is a pMOS device, the at least two silicide layers may comprise titanium silicide or tantalum silicide (e.g., due to a low Schottky barrier height requirement for these materials in a pMOS device, which reduces resistance). As another example, when the semiconductor device 200 is an nMOS device, the at least two silicide layers may comprise nickel silicide or cobalt silicide (e.g., due to a low Schottky barrier height requirement of these materials in an nMOS device, which reduces resistance).

The capping layer 232 is a layer to reduce or prevent oxidation of one or more of the conformal silicide layers of the multi-silicide structure 226. For example, when the multi-silicide structure 226 includes only the first conformal silicide layer 228 and the second conformal silicide layer 230, the capping layer 232 protects the first conformal silicide layer 228 and the second conformal silicide layer 230 from oxidation. In some implementations, the capping layer 232 is a metal layer or is a metal compound layer. In some implementations, when the capping layer 232 is a metal layer, the capping layer 232 includes platinum (Pt), gold (Au), silver (Ag), copper (Cu), cobalt (Co), nickel (Ni), Ti, tantalum (Ta), molybdenum (Mo), tungsten (W), ruthenium (Ru), iridium (Ir), and/or a metal with a resistance that is lower than that of TiN, among other examples. In some implementations, when the capping layer 232 is a metal compound layer, the capping layer 232 includes a metal nitride, such as TiN, cobalt nitride (CoN), nickel nitride (NiN), tantalum nitride (TaN), tungsten nitride (WN), molybdenum nitride (MoN), and/or a metal compound with a resistance that is lower than that of TiN, among other examples. In some implementations, when the capping layer 232 is a metal oxide layer, the capping layer 232 includes a metal oxide, such as ruthenium oxide ($RuO_2$), iridium oxide ($IrO_2$), indium tin oxide (ITO), aluminum doped zinc oxide (AlZnO), a transparent metal oxide, and/or a metal oxide with a resistance that is lower than that of TiN, among other examples. In some implementations, the type of material from which the capping layer 232 is formed may be selected such that a resistance of a material of the capping layer 232 is less than a resistance of a material of the contact structure 234. In some implementations, a thickness of the capping layer 232 may be in a range from approximately 10 Å to approximately 40 Å. However, other values for the thickness the capping layer 232 are within the scope of the present disclosure. A capping layer 232 with a thickness less than approximately 10 Å may provide insufficient protection for the one or more conformal silicide layers of the multi-silicide structure 226. A capping layer 232 with a thickness greater than approximately 40 Å may increase contact resistance in the semiconductor device 200 and, further, may not provide appreciable benefit in terms of protection of the one or more conformal silicide layers of the multi-silicide structure 226 (e.g., as compared to a capping layer 232 with a thickness in the range from approximately 10 Å to approximately 40 Å).

The contact structure 234 is a structure (e.g., a contact plug) that provides electrical contact to the source 206/drain 208 of the semiconductor device 200. In some implementations, the contact structure 234 may include, for example, Ru, W, Mo, Co, Al, a metal material, and/or another type of conductive material. In some implementations, the contact structure 234 does not have a sidewall glue layer for adhering the contact structure 234 to a sidewall of a recess in the dielectric material 224. However, as described above, the dielectric material 224 may, in some implementations, be doped with the enhancement element (e.g., Ge, Sn, or another element with an atomic size larger than Si) to seal the contact structure 234 within the dielectric material 224.

As indicated above, FIG. 2 is provided as an example. Other examples may differ from what is described with regard to FIG. 2. For example, while the example semiconductor device 200 in FIG. 2 forms a particular 3D GAA FET structure, the semiconductor device 200 may in practice include one or more other and/or different semiconductor layers and/or a different structure than shown in FIG. 2 (e.g., such that the semiconductor device 200 forms a 3D GAA FET with a different structure or forms a type of semiconductor device other than a 3D GAA FET). As another example, the multi-silicide structure 226 in the semiconductor device 200 may include a different number of conformal silicide layers (e.g., more than two conformal silicide layers) than shown in FIG. 2.

FIGS. 3A-3J are diagrams of an example implementation 300 described herein. Example implementation 300 may be an example process or method for forming the semiconductor device 200. In some implementations, the various example techniques and procedures described in connection with FIGS. 3A-3J may be used in connection with other semiconductor devices described herein, such as the semiconductor device 400 of FIG. 4.

Figure 3A:
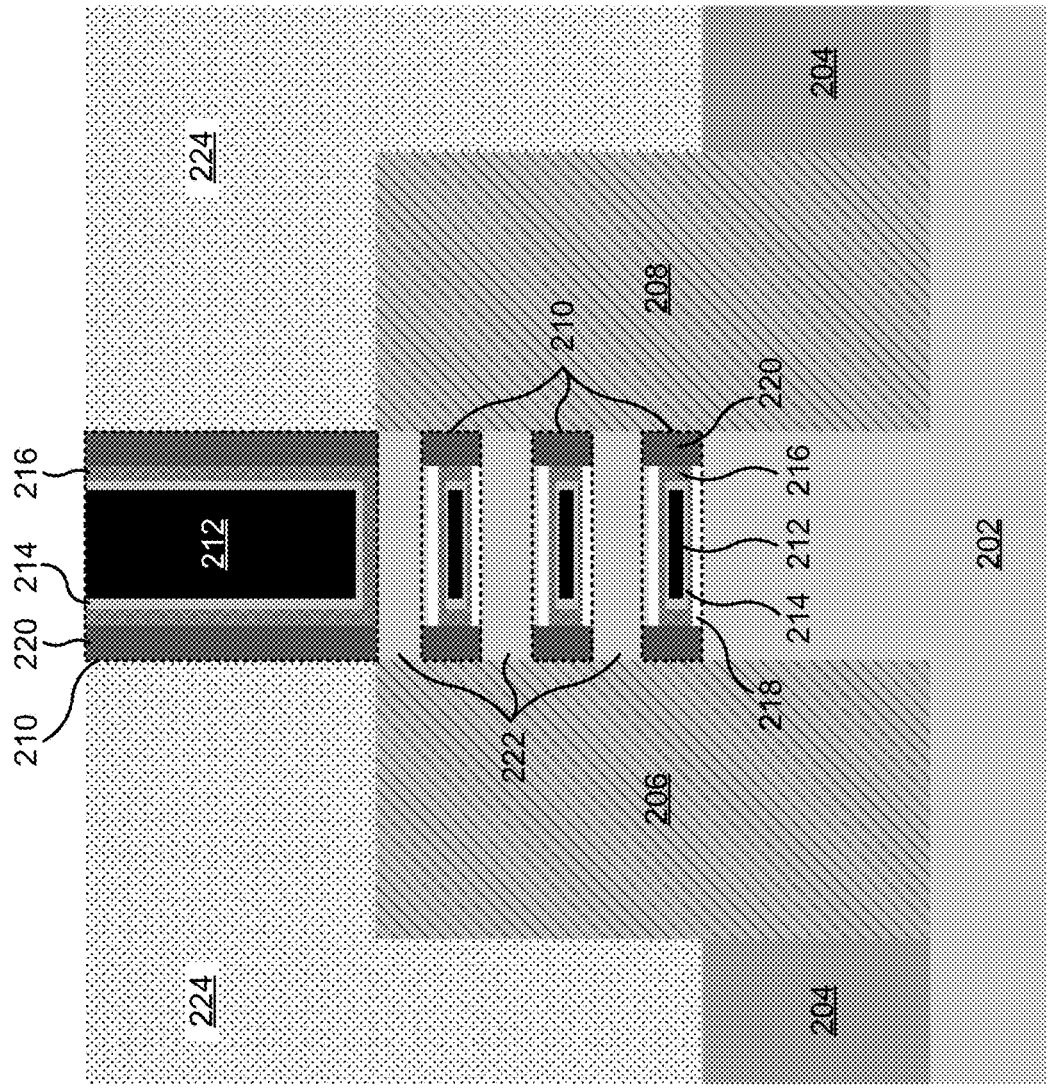
FIGS. 3A-3J are diagrams of an example implementation described herein.

As shown in FIG. 3A, a semiconductor structure, such as a 3D GAA structure including the STI layer 204, the source 206, the drain 208, the gate structure 210, the group of channel structures 222, and the dielectric material 224, is formed on the substrate 202. In some implementations, one or more of the semiconductor processing tools 102-116 may form the 3D GAA structure shown in FIG. 3A. As noted above, the 3D GAA structure of the semiconductor device 200 is provided as an example, and other structures are possible.

Figure 3B:
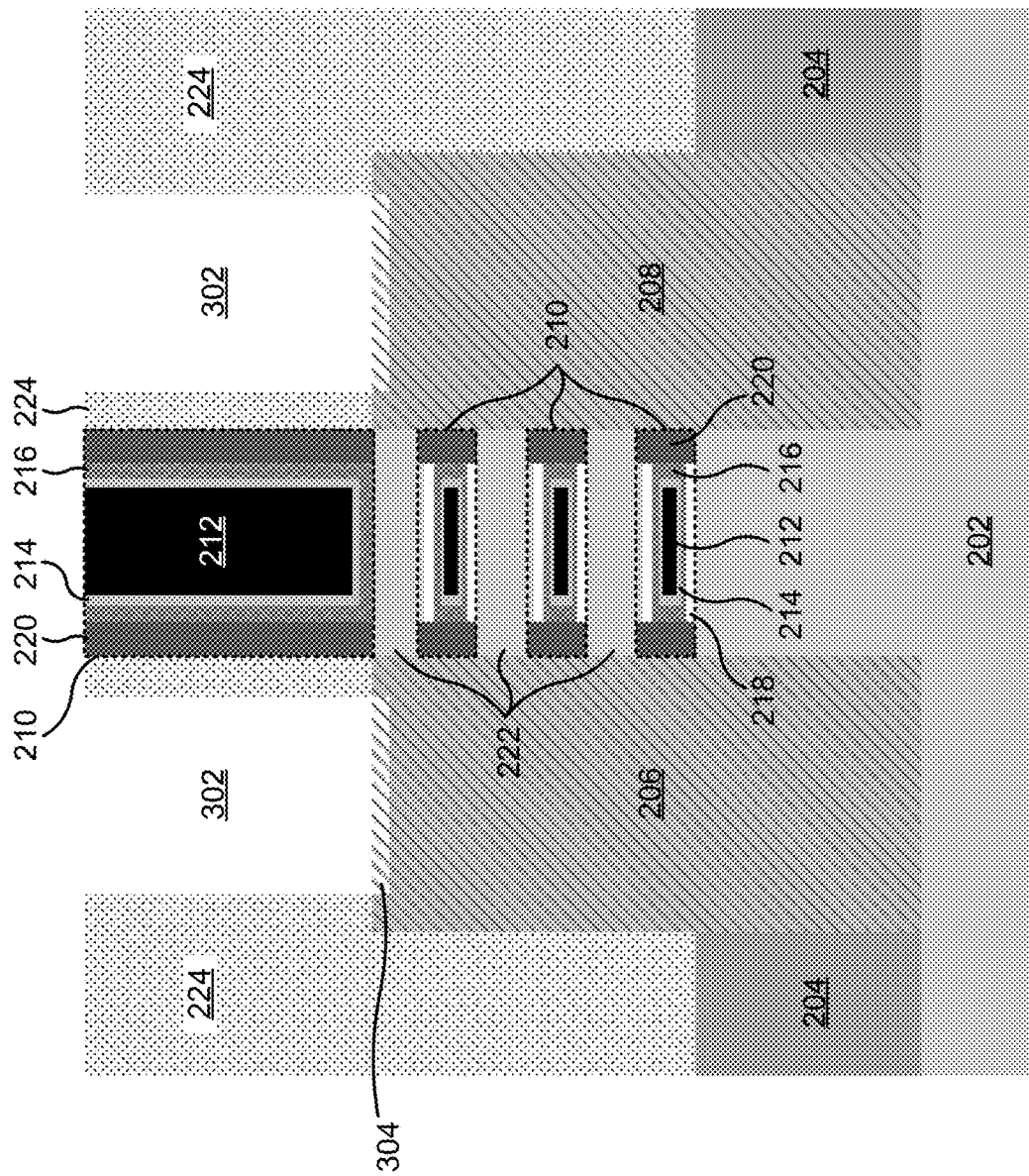

As shown in FIG. 3B, recesses 302 may be etched in the dielectric material 224 over the source 206/drain 208. In some implementations, as shown, the recesses 302 may extend through the dielectric material 224 to or through a top surface of the source 206/drain 208. In some implementations, to form the recesses 302, the deposition tool 102 may deposit a photoresist layer on the dielectric material 224 and one or more other exposed surfaces of the semiconductor device 200. The exposure tool 104 may form a pattern in the photoresist layer by exposing the photoresist layer to a radiation source, such as a UV source (e.g., a deep UV light source, an extreme UV (EUV) light source, and/or the like), an x-ray source, or an electron beam (e-beam) source, to transfer the pattern from a photomask to the photoresist layer. The developer tool 106 may perform a development operation that includes one or more techniques to develop the pattern in the photoresist layer. The etch tool 108 may etch the dielectric material 224 based on the pattern formed in the photoresist layer to form the recesses 302. For example, the etch tool 108 may perform a wet etching technique (e.g., where the dielectric material 224 is exposed or submerged in a chemical that etches or removes material at a particular etch rate), a dry etching device (e.g., where a plasma is used to sputter material), or another type of etching technique. The remaining portions of the photoresist layer may be removed after the dielectric material 224 is etched to form the recesses 302. As shown in FIG. 3B, in some implementations, a native oxide 304 may form on a surface of the source 206/drain 208 within the recesses 302 (e.g., due to oxidation of the source 206/drain 208).

Figure 3C:
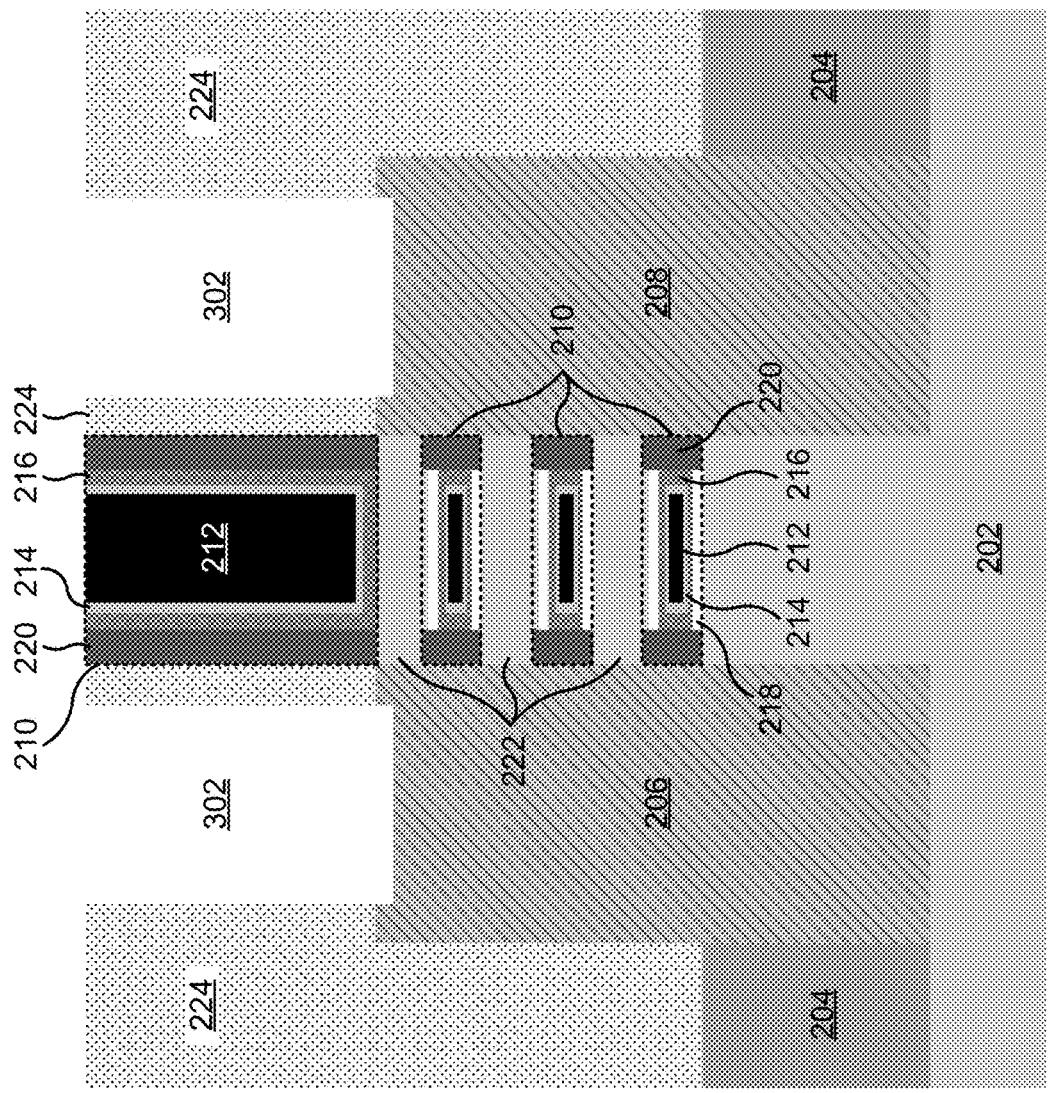

As shown in FIG. 3C, the native oxide 304 may be removed from the bottom surfaces of the recesses 302. For example, the pre-cleaning tool 116 may perform a pre-cleaning process to remove the native oxide 304 from the bottom surfaces of the recesses 302.

Figure 3D:
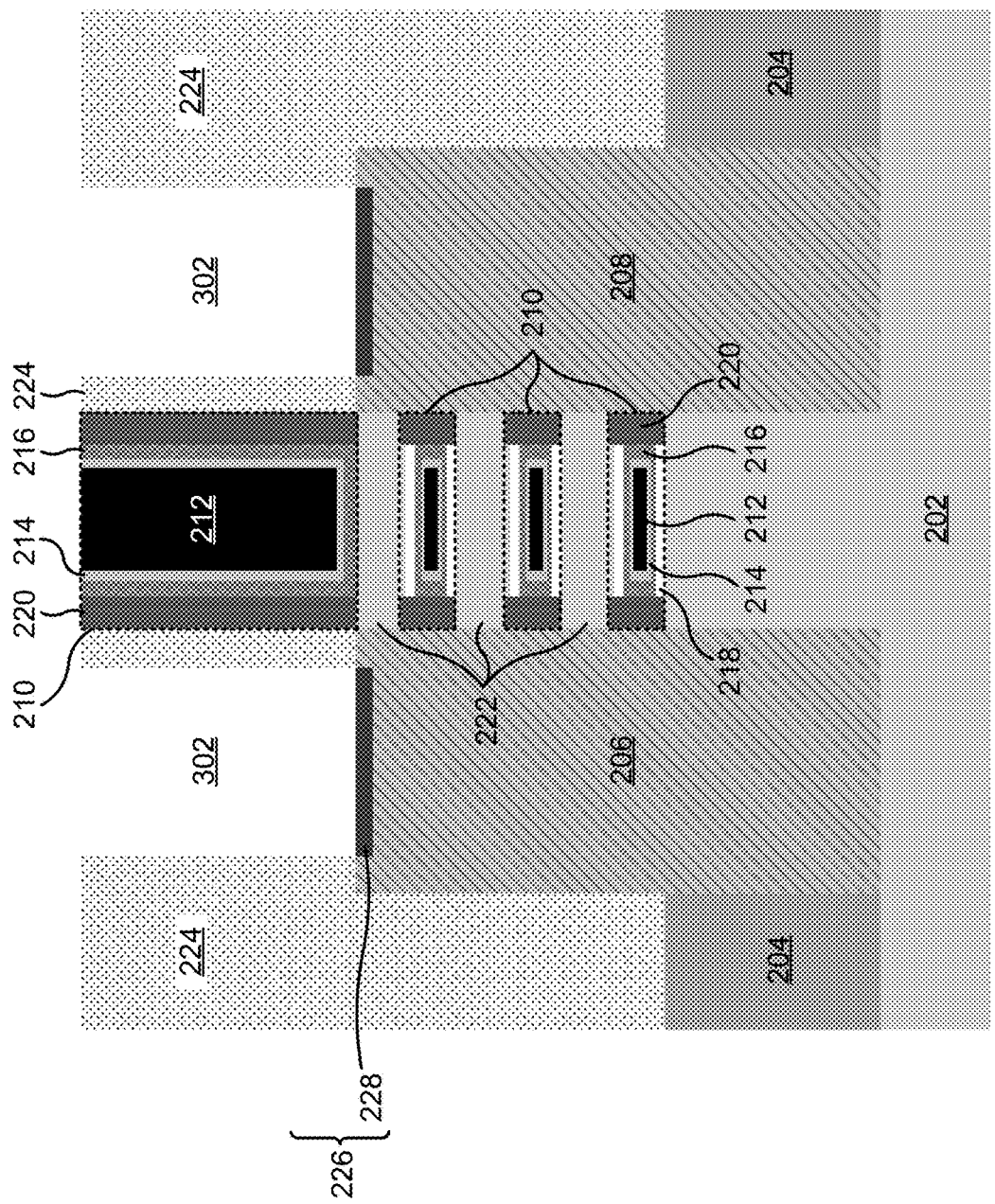

FIGS. 3D-3G illustrate formation of the multi-silicide structure 226 of the semiconductor device 200, including formation of the first conformal silicide layer 228, the second conformal silicide layer 230, and the capping layer 232. As shown in FIG. 3D, the first conformal silicide layer 228 may be formed on the bottom surface of the recesses 302. For example, the deposition tool 102 may deposit a metal (e.g., Ti) on the source 206/drain 208 at the bottom surface the recesses 302 to form the first conformal silicide layer 228, as described above. In some implementations, as described above, the first conformal silicide layer 228 may be formed using a (self-limiting) CVD process to enable formation of the first conformal silicide layer 228 as a conformal silicide.

Figure 3E:
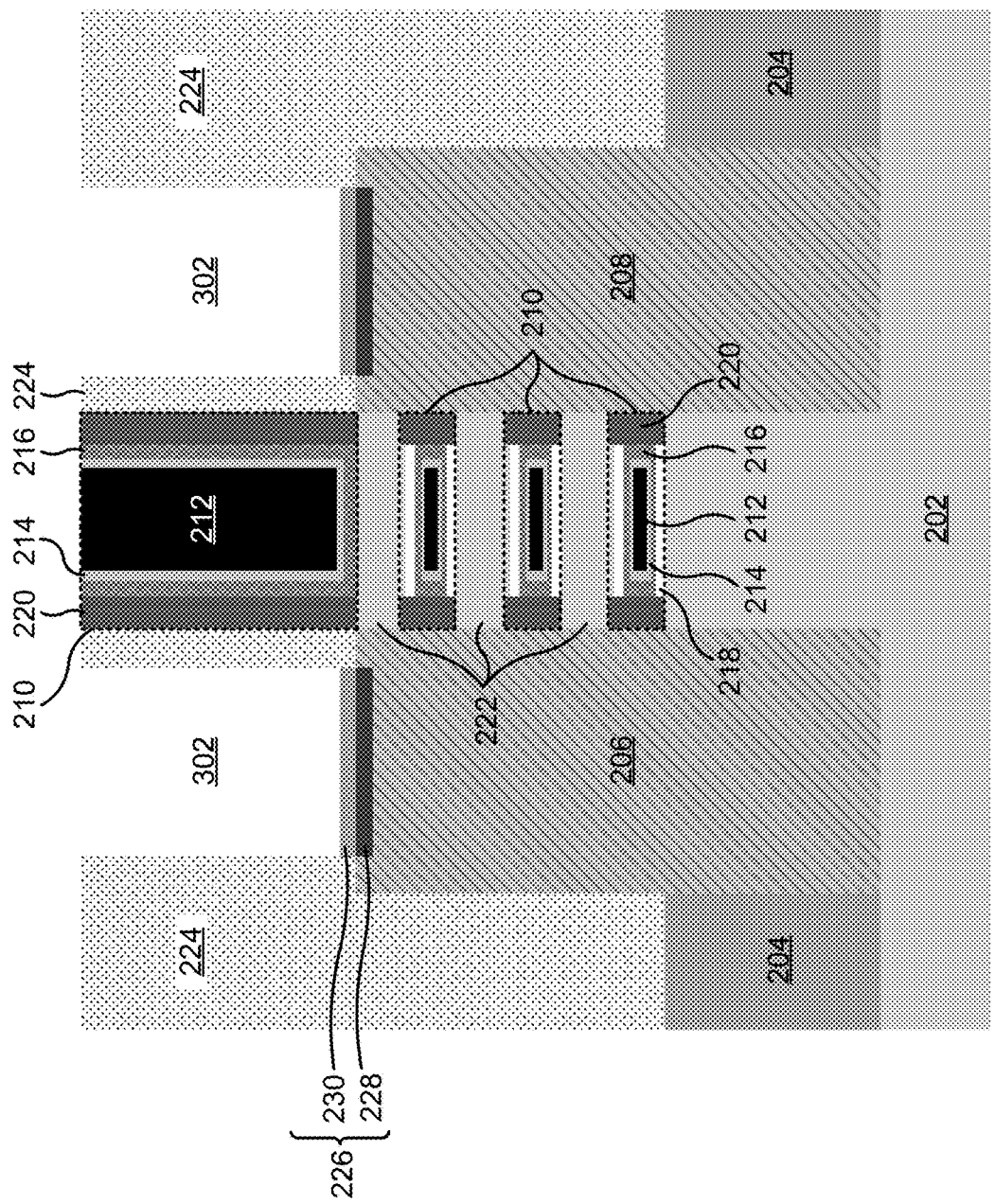

As shown in FIG. 3E, the second conformal silicide layer 230 may be formed on the first conformal silicide layer 228. For example, the deposition tool 102 may perform a soaking process (e.g., a silane soaking process) on the first conformal silicide layer 228 to grow the second conformal silicide layer 230 on the first conformal silicide layer 228, as described above. In some implementations, as described above, the second conformal silicide layer 230 may be formed using a (self-limiting) soaking process to enable formation of the second conformal silicide layer 230 as a conformal silicide.

Figure 3F:
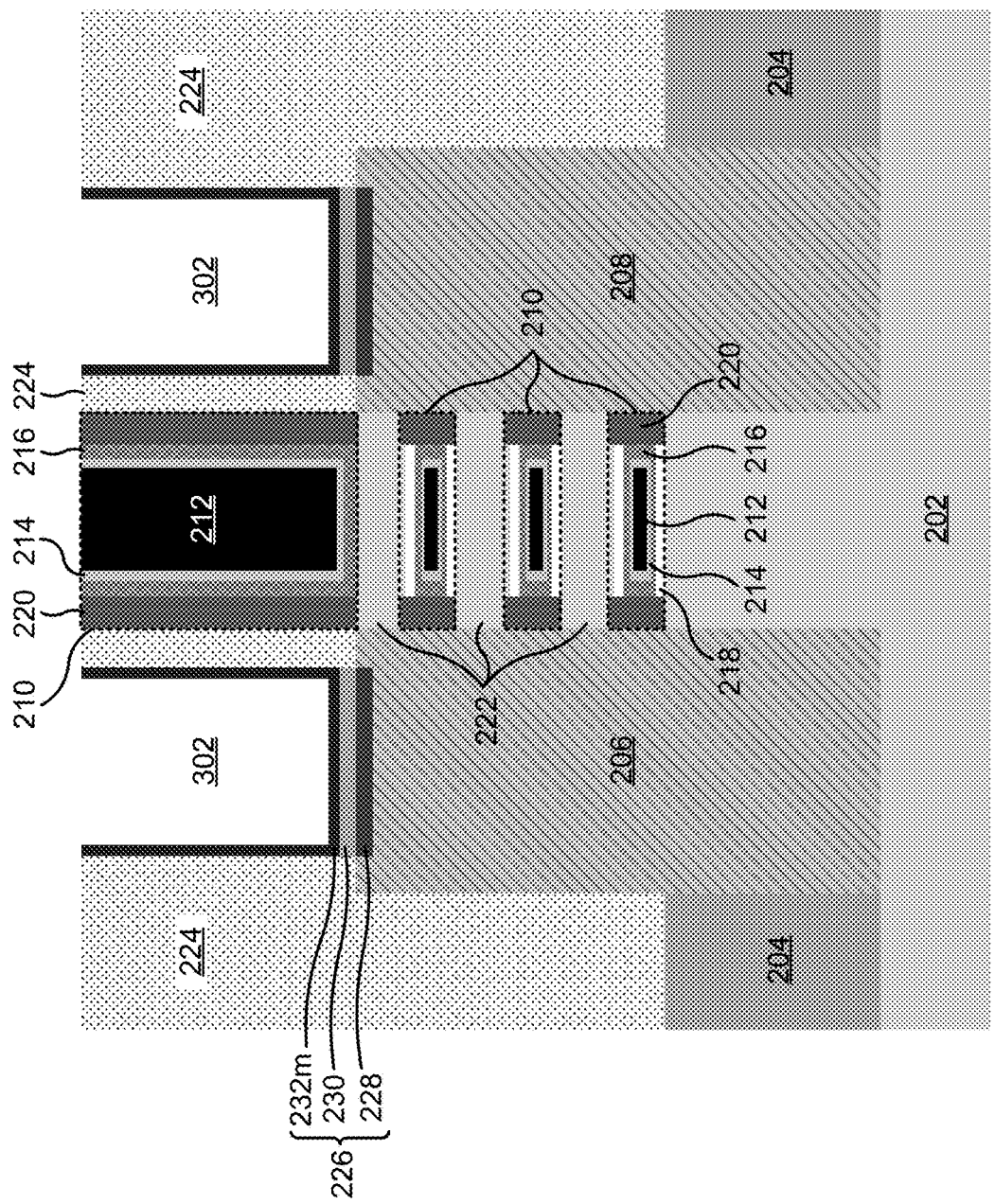

As shown in FIG. 3F, a capping layer material 232m may be formed over the second conformal silicide layer 230 and on one or more sidewalls of the recesses 302. For example, the deposition tool 102 may perform a growth process (e.g., an ammonia ($NH_3$) treatment process) within the recesses 302 to grow the capping layer material 232m over the second conformal silicide layer 230 and on one or more sidewalls of the recesses 302.

Figure 3G:
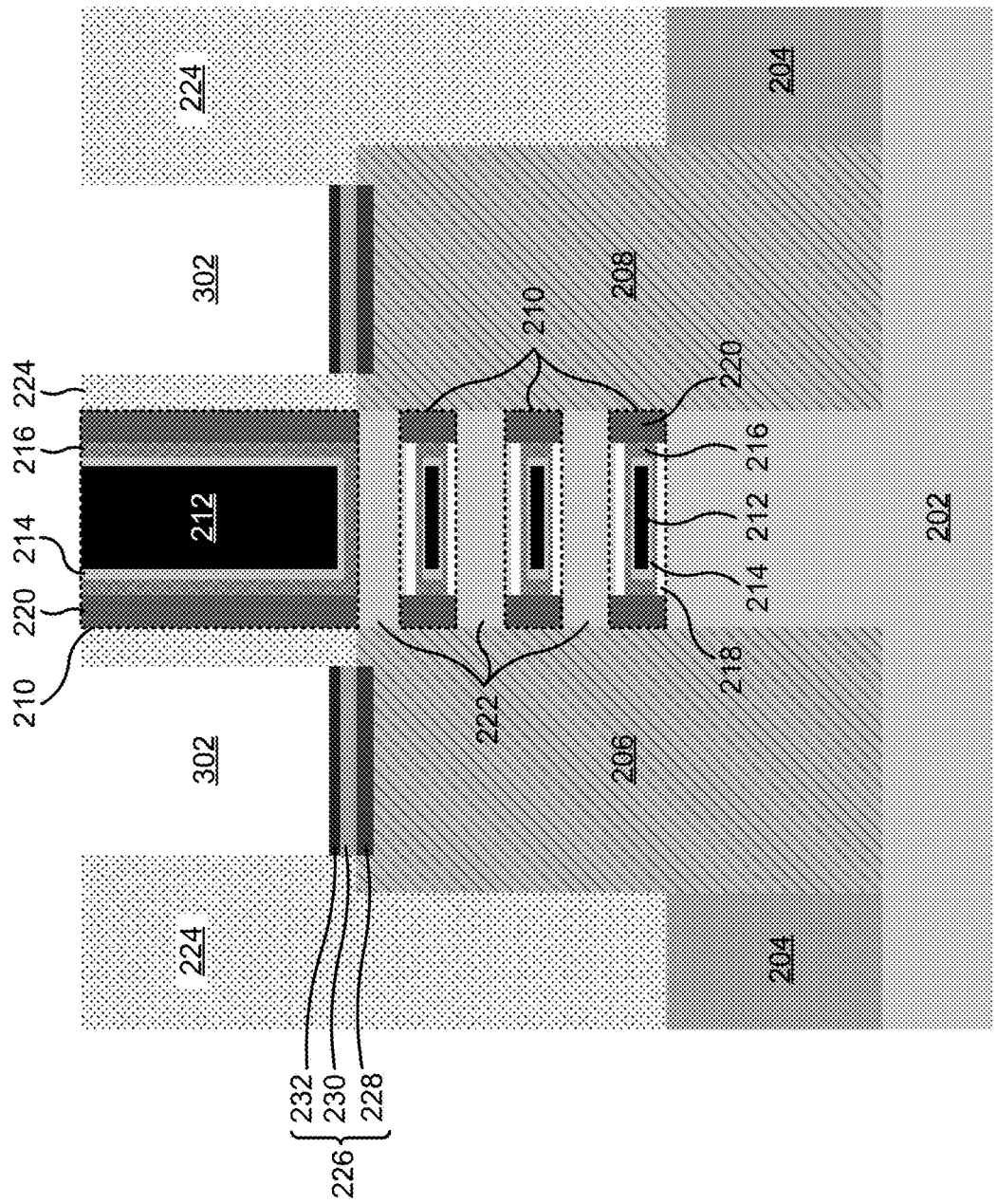

As shown in FIG. 3G, the capping layer material 232m may be removed from the one or more sidewalls of the recesses 302 to form the capping layer 232. For example, the etch tool 108 may perform an etch process to etch the capping layer material 232m from the sidewalls of the recesses 302 to form the capping layer 232 (e.g., such that the capping layer 232 is present only over the second conformal silicide layer 230). In some implementations, the etch process may be an ALE process. In some implementations, a set of etch process parameters used for the ALE process may be determined using an analysis model configured to determine sets of etch process parameters, as described in further detail below.

Figure 3H:
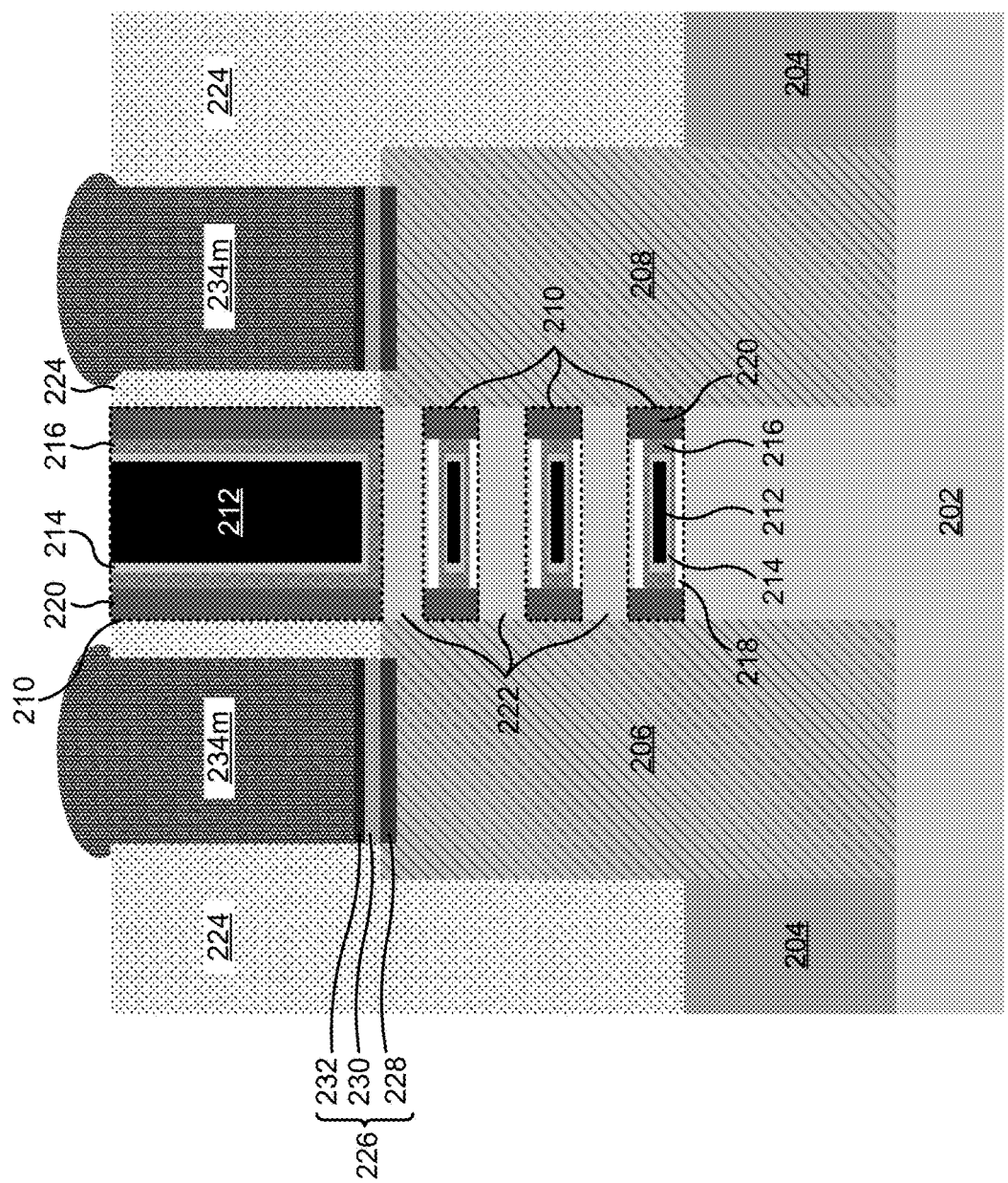
Figure 3I:
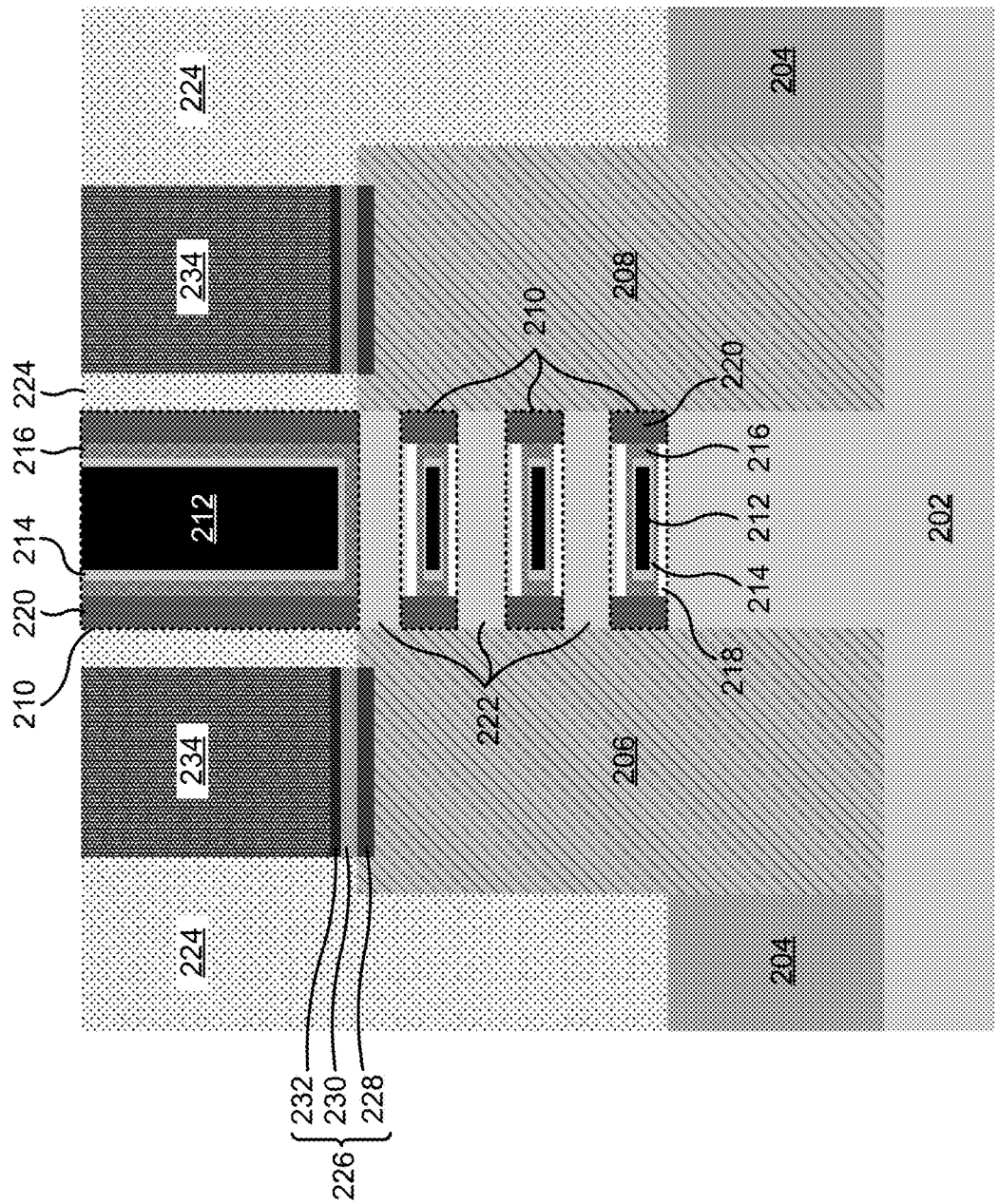

FIGS. 3H and 3I illustrate formation of the contact structures 234 within the recesses 302. As shown in FIG. 3H, a contact structure material 234m may be formed in the recesses 302. For example, the deposition tool 102 may perform a CVD that provides bottom-up growth of the contact structure material 234m in the recesses 302. In some implementations, as shown in FIG. 3H, the contact structure material 234m overfills the recesses 302 (e.g., such that some portion of the contact structure material 234m) is on the dielectric material 224 adjacent to the recesses 302.

As shown in FIG. 3I, the contact structure 234 is formed by planarization of a surface of the semiconductor device 200. For example, the planarization tool 100 may perform a CMP of to remove excess contact structure material 234m and planarize a top surface of the semiconductor device 200.

Figure 3J:
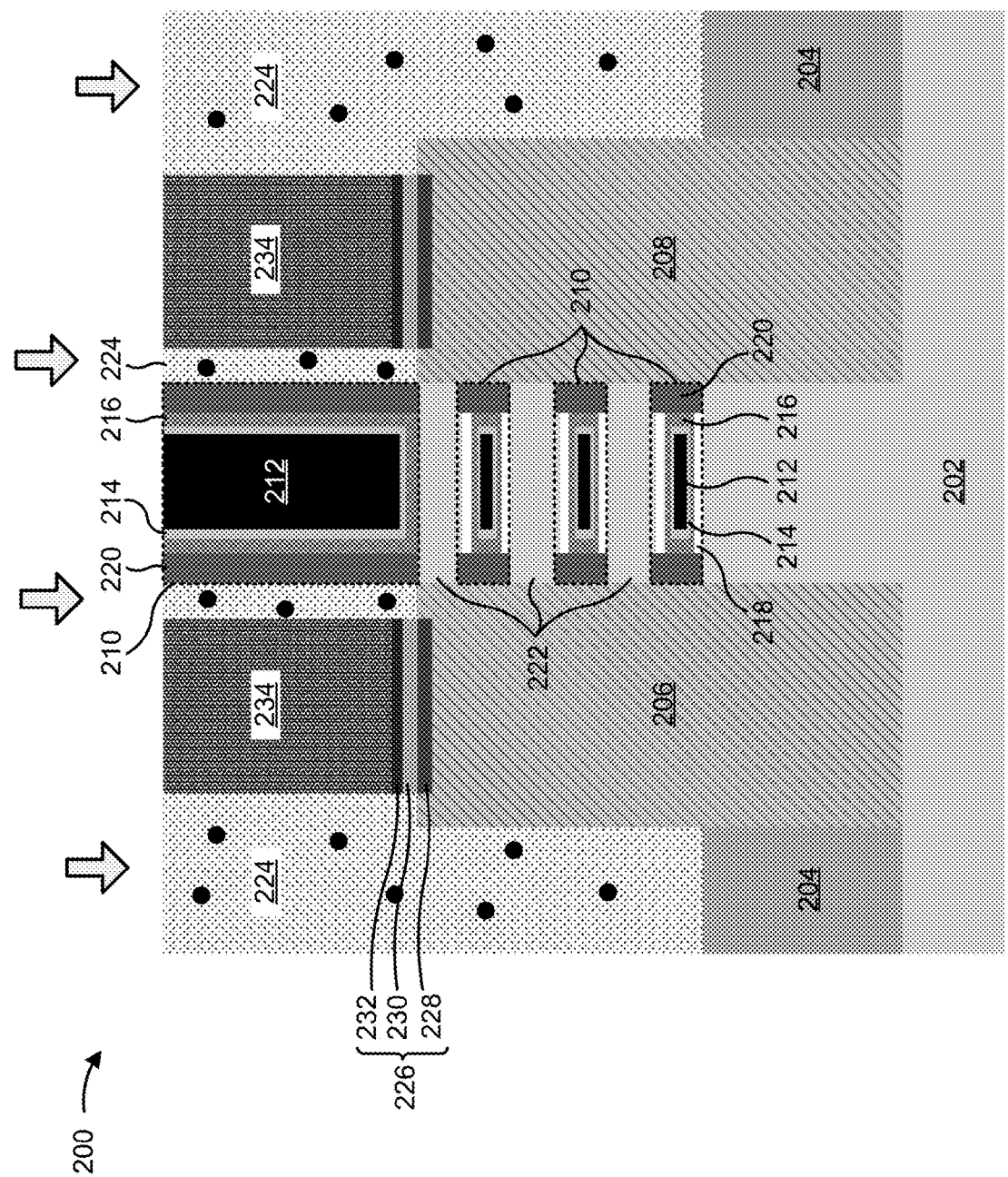

As shown in FIG. 3J, the dielectric material 224 may (optionally) be doped with the enhancement element after planarization of the semiconductor device 200. For example, the ion implantation tool 112 may implant ions (e.g., Ge ions or Sn ions, indicated by black circles in FIG. 3J) into the dielectric material 224 to dope the dielectric material 224 with the enhancement element.

As indicated above, FIGS. 3A-3J are provided as an example. Other examples may differ from what is described with regard to FIGS. 3A-3J.

As noted above, in some implementations, the multi-silicide structure 226 may include more than two conformal silicide layers. FIG. 4 is a diagram of an example semiconductor device 400 in which the multi-silicide structure 226 includes four conformal silicide layers. Structures and layers of the semiconductor device 400 are similar to those of the semiconductor device 200 described above.

Figure 4:
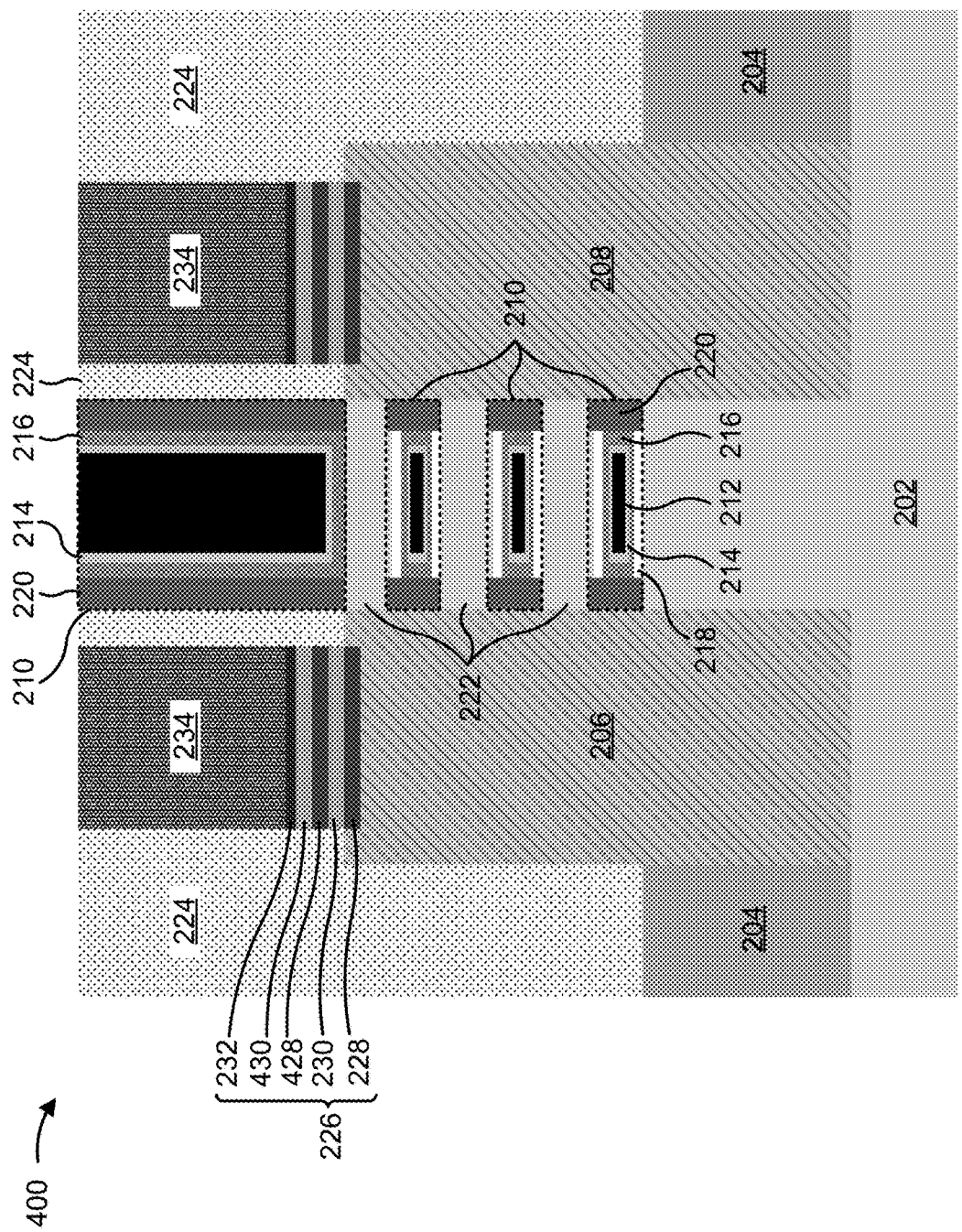
FIG. 4 is a diagram of an example semiconductor device described herein.

As shown in FIG. 4, in addition to the first conformal silicide layer 228 and the second conformal silicide layer 230, the semiconductor device 400 includes a third conformal silicide layer 428 and a fourth conformal silicide layer 430. As shown, the third conformal silicide layer 428 is formed on the second conformal silicide layer 230 within the multi-silicide structure 226, and the fourth conformal silicide layer 430 is formed on the third conformal silicide layer 428. In some implementations, a ratio of metal to silicon in the third conformal silicide layer 428 is greater than 1. However, other ratios of metal to silicon in the third conformal silicide layer 428 are within the scope of the present disclosure. In some implementations, a ratio of silicon to metal in the fourth conformal silicide layer 430 is greater than 1. However, other ratios of silicon to metal in the fourth conformal silicide layer 430 are within the scope of the present disclosure. In some implementations, the third conformal silicide layer 428 may be formed in a similar manner to that of the first conformal silicide layer 228 (e.g., using a Ti CVD process). In some implementations, the fourth conformal silicide layer 430 may be formed in a similar manner to that of the second conformal silicide layer 230 (e.g., using a silane soaking process). The conformal silicide layers shown in the semiconductor device 400 illustrate the alternation of metal-rich and silicon-rich silicides in the multi-silicide structure 226. In some implementations, the multi-silicide structure 226 including more than two conformal silicide layers, such as the multi-silicide structure 226 shown in FIG. 4, may enable a reduction in contact reduction in the semiconductor device 200, as described above.

As indicated above, FIG. 4 is provided as an example. Other examples may differ from what is described with regard to FIG. 4. For example, while the example semiconductor device 400 in FIG. 4 forms a particular 3D GAA FET structure, the semiconductor device 400 may in practice include one or more other and/or different semiconductor layers and/or a different structure than shown in FIG. 4 (e.g., such that the semiconductor device 400 forms a 3D GAA FET with a different structure or forms a type of semiconductor device other than a 3D GAA FET). As another example, the multi-silicide structure 226 in the semiconductor device 400 may include a different number of conformal silicide layers (e.g., more than four conformal silicide layers) than shown in FIG. 4.

Figure 5:
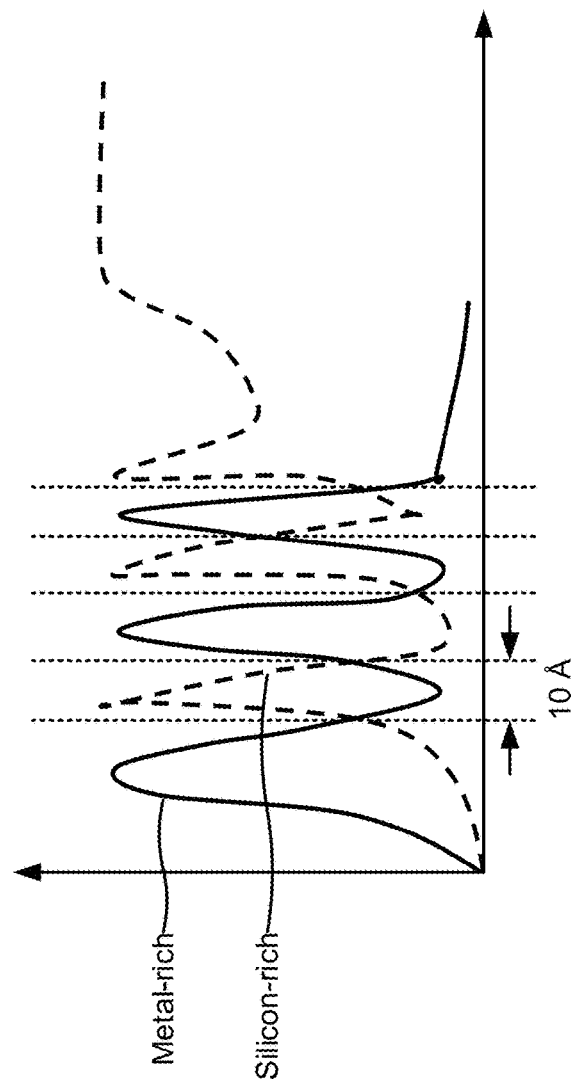
FIG. 5 is a diagram of an example line scan diagram of a multi-silicide structure described herein.

FIG. 5 is a diagram of an example line scan diagram of an example multi-silicide structure 226 described herein. As shown in FIG. 5, the multi-silicide structure 226 may include metal-rich conformal silicide layers (e.g., the first conformal silicide layer 228 and the third conformal silicide layer 428) and silicon-rich conformal silicide layers (e.g., the second conformal silicide layer 230 and the fourth conformal silicide layer 430). As further shown, the metal-rich conformal silicide layers and the silicon-rich conformal silicide layers alternate within the multi-silicide structure 226. As further shown in FIG. 5, a given conformal silicide layer may in some implementations have a thickness of approximately 10 Å. However, other values for the thickness the given conformal silicide layer are within the scope of the present disclosure.

As indicated above, FIG. 5 is provided as an example. Other examples may differ from what is described with regard to FIG. 5.

Figure 6:
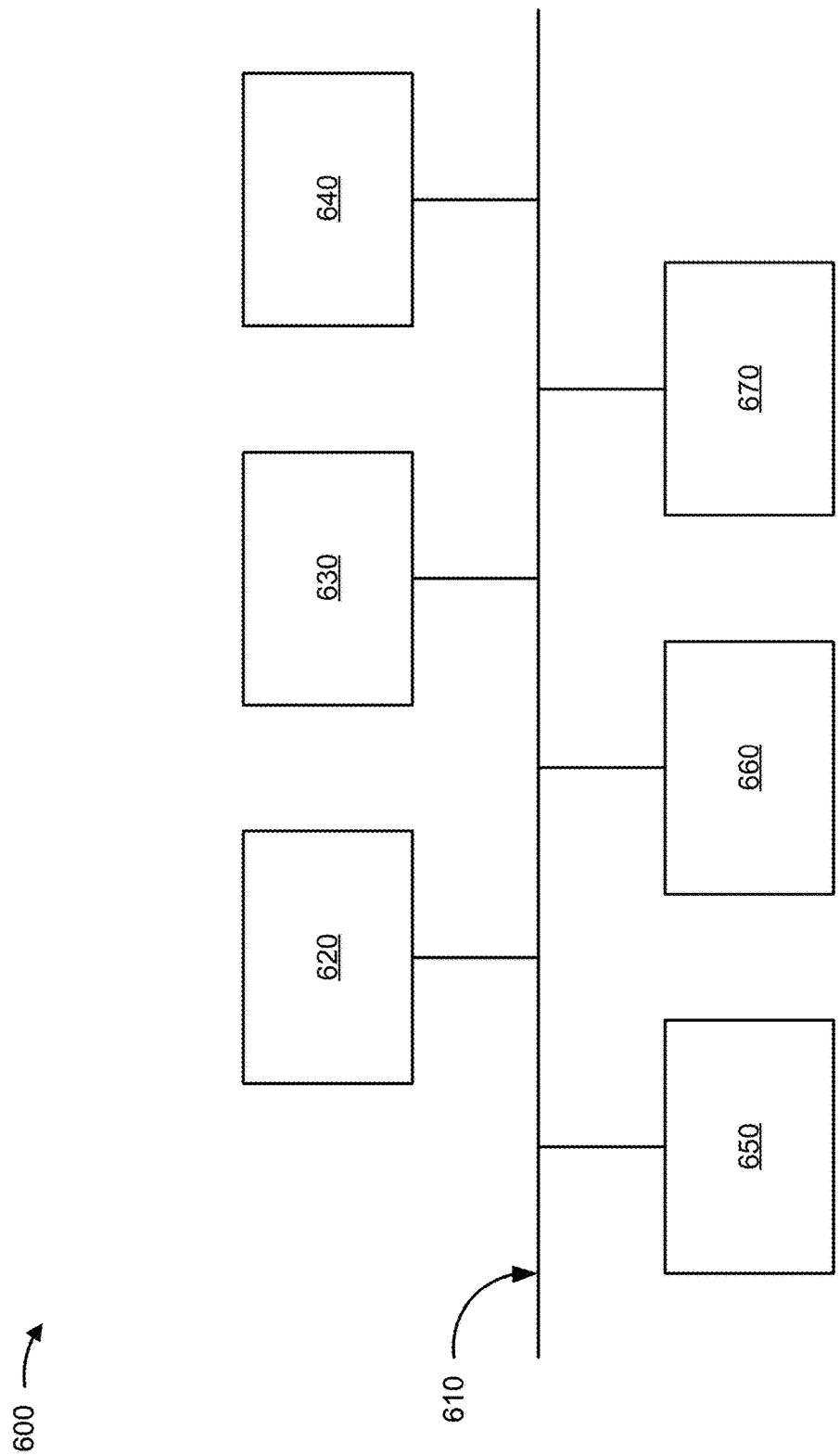
FIG. 6 is a diagram of example components of one or more devices of FIG. 1.

FIG. 6 is a diagram of example components of a device 600. In some implementations, one or more of the semiconductor processing tools 102-116 and/or the wafer/die transport tool 118 may include one or more devices 600 and/or one or more components of device 600. Additionally, or alternatively, the controller 802 described in association with FIG. 8 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
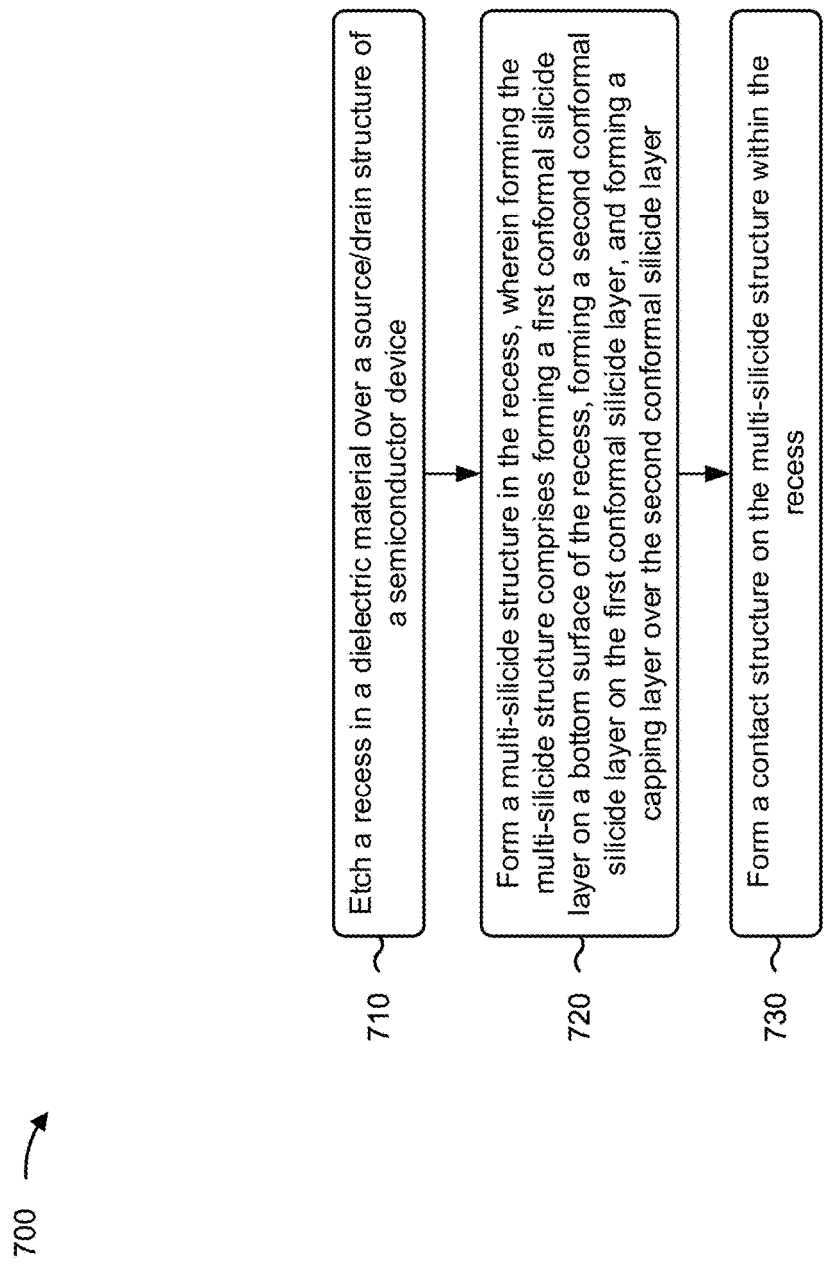
FIG. 7 is a flowchart of an example process relating to forming a semiconductor device described herein.

FIG. 7 is a flowchart of an example process 700 relating to forming the semiconductor device 200 or the semiconductor device 400 described herein. In some implementations, one or more process blocks of FIG. 7 may be performed by one or more semiconductor processing tools (e.g., one or more semiconductor processing tools 102-116). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include etching a recess in a dielectric material over a source/drain of a semiconductor device (block 710). For example, the one or more semiconductor processing tools 102-116 may etch a recess (e.g., a recess 302) in a dielectric material (e.g., a dielectric material 224) over a source/drain (e.g., a source 206 or a drain 208) of a semiconductor device (e.g., a semiconductor device 200, a semiconductor device 400), as described above.

As further shown in FIG. 7, process 700 may include forming a multi-silicide structure in the recess, where forming the multi-silicide structure comprises forming a first conformal silicide layer on a bottom surface of the recess, forming a second conformal silicide layer on the first conformal silicide layer, and forming a capping layer over the second conformal silicide layer (block 720). For example, the one or more semiconductor processing tools may form a multi-silicide structure (e.g., a multi-silicide structure 226) in the recess, where forming the multi-silicide structure comprises forming a first conformal silicide layer (e.g., a first conformal silicide layer 228) on a bottom surface of the recess, forming a second conformal silicide layer (e.g., a second conformal silicide layer 230) on the first conformal silicide layer, and forming a capping layer (e.g., a capping layer 232) over the second conformal silicide layer, as described above.

As further shown in FIG. 7, process 700 may include forming a contact structure on the multi-silicide structure within the recess (block 730). For example, the one or more semiconductor processing tools may form a contact structure (e.g., a contact structure 234) on the multi-silicide structure within the recess, as described above.

Process 700 may include additional implementations, such as any single implementation or any combination of implementations described below and/or in connection with one or more other processes described elsewhere herein.

In a first implementation, process 700 includes performing a pre-clean in the recess prior to forming the multi-silicide structure in the recess to remove a native oxide (e.g., a native oxide 304) from at least the bottom surface of the recess.

In a second implementation, alone or in combination with the first implementation, forming the first conformal silicide layer comprises depositing a metal material on the bottom surface of the recess using a CVD process.

In a third implementation, alone or in combination with one or more of the first and second implementations, forming the second conformal silicide layer comprises growing the second conformal silicide layer on the first conformal silicide layer using a soaking process.

In a fourth implementation, alone or in combination with one or more of the first through third implementations, forming the capping layer comprises forming a capping layer material (e.g., the capping layer material 238m) over the second conformal silicide layer and on one or more sidewalls of the recess, and etching the capping layer material from the one or more sidewalls of the recess.

In a fifth implementation, in combination with the fourth implementation, the capping layer material is etched from the one or more sidewalls of the recess using an ALE process, wherein a set of etch process parameters used for the ALE process is determined using an analysis model configured to determine sets of etch process parameters.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
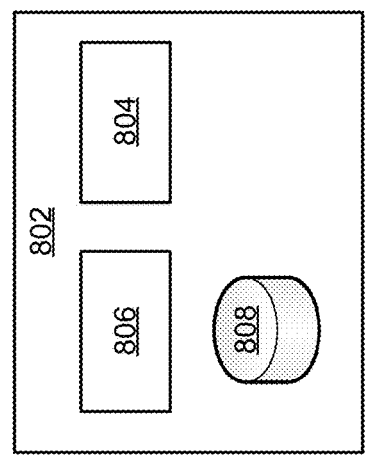
FIG. 8 is a diagram of example components of a controller of one or more devices of FIG. 1.

FIG. 8 is a diagram illustrating example 800 components of a controller 802 capable of performing dynamic tuning of etch parameters to be used by the etch tool 108 for performing an etch process. In some implementations, the etch process to be performed by the etch tool 108 may be an ALE process. In some implementations, the etch process to be performed by the etch tool 108 may be an etch process for removing the capping layer material 232m from the sidewalls of the recesses 302, as described above.

In some implementations, the controller 802 includes a processor or a computing device, among other examples. In some implementations, the controller 802 is included in the etch tool 108. In some implementations, the controller 802 is separate from the etch tool 108 and is communicatively coupled to the etch tool 108 (e.g., by a direct connection or a network). In some implementations, the controller 802 is included in another tool, such as a wafer analysis tool, a scanning electron microscopy (SEM) device, a transmission electron microscopy (TEM) device, and/or another type of tool. As shown in FIG. 8, the controller 802 may include an analysis model 804, a training component 806, and a training information storage component 808.

The analysis model 804 is a component configured to determine adjusted etch process parameters to be used by the etch tool 108 when performing an iteration of the etch process. The iteration of the etch process may include a cycle of the etch process or a run of the etch process. In some implementations, the analysis model 804 may be configured or trained to generate adjusted etch process parameters that cause a result of the iteration of the etch process (e.g., an etch resulting from the iteration of the etch process) to have one or more target etch characteristics. Further details regarding the target etch characteristics are provided below. In some implementations, the analysis model 804 is trained by the training component 806.

The training component 806 is a component configured to train the analysis model 804 using a machine learning process. In some implementations, the machine learning process implemented by the training component 806 trains the analysis model 804 to determine adjusted etch process parameters for an upcoming (e.g., next) iteration of the etch process (e.g., to cause a result of the iteration of the etch process to have one or more target etch characteristics).

The training information storage component 808 is a component that receives, determines, or stores training information associated with training the analysis model 804. In some implementations, the training information may include historical actual etch characteristics and historical etch process parameters. The historical actual etch characteristics include information related to etches resulting from previous iterations of the etch process. The historical etch process parameters include etch process parameters used for the iterations of the etch process that generated the etches described by the historical actual etch characteristics. In some implementations, the training component 806 utilizes the historical actual etch characteristics and the historical etch process parameters to train the analysis model 804 with a machine learning process, as described in further detail below.

The historical actual etch characteristics may include, for example, information related to a depth of a previously performed iteration of the etch process. As another example, the historical actual etch characteristics may include information related to a depth of the etch at one or more intermediate phases or stages of the previously performed iteration of the etch process. Thus, the historical actual etch characteristics may, in some implementations, include information related to the depth of the etch at various phases or stages of the previously performed iteration of the etch process (e.g., in addition to information related to a total depth of the etch after completion of the previously performed iteration of the etch process). As another example, the historical actual etch characteristics may include information related to an etch area or etch size resulting from the previously performed iteration of the etch process. As another example, the historical actual etch characteristics may include information related to an etch uniformity achieved by the previously performed iteration of the etch process. Notably, these types of historical actual etch characteristics are provided as examples and, in practice, the historical actual etch characteristics may include combinations of these types of historical actual etch characteristics and/or one or more other types of information associated with the previously performed iteration of the etch process.

As noted above, the historical etch process parameters include etch process parameters used for previously performed iterations of the etch process that generated the etches described by the historical actual etch characteristics. Accordingly, for each previously performed iteration of the etch process for which historical actual etch characteristics are stored, the historical etch process parameters may include the etch process parameters used for, or present during, the previously performed iteration of etch process.

The historical etch process parameters may include, for example, information related to an age of an etch chamber of the etch tool 108 at the time of the previously performed iteration of the etch process. As another example, the historical etch process parameters may include a total number of iterations of the etch process performed in the etch chamber of the etch tool 108 at the time of the previously performed iteration of the etch process. As another example, the historical etch process parameters may include a number of iterations of the etch process performed in the etch chamber of the etch tool 108 at the time of the previously performed iteration of the etch process since a most recent cleaning cycle of the etch chamber. In some implementations, the historical etch process parameters may include a combination of these historical etch process parameters and/or one or more other types of information related to the etch chamber at the time of the previously performed iteration of the etch process.

As another example, the historical etch process parameters may include information related to compounds or fluids introduced into the etch chamber of the etch tool 108 during the previously performed iteration of the etch process. The information related to the compounds may include, for example, types of compounds, phases of compounds (e.g., solid, gas, or liquid), mixtures of compounds, or other information related to compounds or fluids introduced into the etch chamber of the etch tool 108. As another example, the historical etch process parameters may include information related to humidity within the etch chamber of the etch tool 108 during the previously performed iteration of the etch process. As another example, the historical etch process parameters may include information related to light absorption, light adsorption, or light reflection related to the etch chamber of the etch tool 108 during the previously performed iteration of the etch process. As another example, the historical etch process parameters may include information related to a length of one or more plumbing fixtures (e.g., pipes, tubes, or conduits) that carried compounds or fluids into the etch chamber of the etch tool 108 during the previously performed iteration of the etch process. As another example, the historical etch process parameters may include information related to a condition of carrier gases that carried compounds or fluids into the etch chamber during the previously performed iteration of the etch process. As another example, the historical etch process parameters may include information related to surface features of a wafer or semiconductor device etched during the previously performed iteration of the etch process. As another example, the historical etch process parameters may include information related to a duration of the previously performed iteration of the etch process. As another example, the historical etch process parameters may include information related to a duration of one or more phases or stages of the previously performed iteration of the etch process. As another example, the historical etch process parameters may include information related to an effective etching density on the wafer or semiconductor device etched by the previously performed iteration of the etch process. As another example, the historical etch process parameters may include information related to a grouping or distribution of etches formed by the previously performed iteration of the etch process. Notably, the types of historical etch process parameters are provided as examples and, in practice, the historical etch process parameters may include a combination of these historical etch process parameters and/or one or more other types of information associated with the previously performed iteration of the etch process.

In some implementations, historical actual etch characteristics and corresponding historical etch process parameters may be gathered for many (e.g., thousands, hundreds of thousands, millions, or the like) of previously performed iterations of the etch process. For example, the training information storage component 808 may store or have access to historical actual etch characteristics and corresponding historical etch process parameters for many iterations (e.g., cycles or runs) of the etch process as performed by the etch tool 108, or for many iterations of the etch process as performed by a group of (similar) etch tools 108.

In some implementations, the training information storage component 808 associates the historical actual etch characteristics with the corresponding historical etch process parameters. In other words, the historical actual etch characteristics associated with a given previously performed iteration of the etch process is linked with the historical etch process parameters associated with that particular previously performed iteration of the etch process. As described in further detail below, the training information stored by the training information storage component 808 can be utilized in a machine learning process to train the analysis model 804 to adjust etch process parameters so as to provide an etch having one or more target etch characteristics.

In some implementations, the analysis model 804 includes a neural network. Notably, while training of the analysis model 804 is described in relation to a neural network, other types of analysis models or algorithms can be used in association with training the analysis model 804. In some implementations, the training component 806 utilizes the training information stored by the training information storage component 808 to train the neural network with a machine learning process. During the training process, the neural network receives, as input, historical etch process parameters from the training information storage component 808, and outputs predicted etch characteristics. In some implementations, the predicted etch characteristics predict one or more etch characteristics for an etch that would result from use of the historical etch process parameters for performing an iteration of the etch process. The predicted etch characteristics may include, for example, a predicted etch depth after the iteration of the etch process, a predicted etch depth at one or more intermediate phases or stages of the iteration of the etch process, a predicted etch area resulting from the iteration of the etch process, or a predicted etch uniformity provided by the iteration of the etch process, among other examples.

In some implementations, the neural network includes a plurality of neural layers. The neural layers include neurons that define one or more internal functions. The internal functions are based on weighting values associated with neurons of each neural layer of the neural network. During training, the controller 802 compares predicted etch characteristics determined for each set of historical etch process parameters in a training set to historical actual etch characteristics associated with the etch that resulted from use of those historical etch process parameters. The controller 802 generates an error function indicating how closely the predicted etch characteristics match the historical actual etch characteristics. The controller 802 then modifies one or more internal functions of the neural network. Because the neural network generates predicted etch characteristics based on the internal functions, modifying the internal functions results in the generation of different predicted etch characteristics for a same set of historical etch process parameters.

Modifying the internal functions can result in predicted etch characteristics that produce comparatively larger error functions (e.g., worse matching to the historical actual etch characteristics) or comparatively smaller error functions (e.g., better matching to the historical actual etch characteristics).

In some implementations, after modifying the internal functions of the neural network, the historical etch process parameters may again be provided as input to the neural network and the analysis model 804 may regenerate predicted actual etch characteristics for the historical etch process parameters. The training component 806 then compares the regenerated predicted etch characteristics to the historical actual etch characteristics. The training component 806 can then modify one or more internal functions of the neural network in the manner described above. This process can be repeated over many iterations of monitoring the error functions and modifying one or more internal functions of the neural network until a set of internal functions is reached that results in predicted etch characteristics that match (e.g., is within an error tolerance of) the historical actual etch characteristics across the training set of the training information. Notably, at a start of the training process, the predicted etch characteristics are not likely to match the historical actual etch characteristics. However, as the training process proceeds through modifications of internal functions of the neural network, the error functions should trend smaller until a set of internal functions is reached that results in predicted etch characteristics that match corresponding historical actual etch characteristics across the training set. Identification of the set of internal functions that results in predicted etch characteristics that match the corresponding historical actual etch characteristics across the training set indicates a completion of the training process, meaning that the analysis model 804 can be used to determine adjusted etch process parameters to be used for performing an iteration of the etch process.

In some implementations, the analysis model 804 utilizes current etch process parameters in association with determining the adjusted etch process parameters. In some implementations, the current etch process parameters include information related to one or more current parameters or conditions of processing equipment associated with performing the etch process. For example, the current etch process parameters may include a current age of an ampoule to be utilized in the iteration of the etch process. The current age of the ampoule can indicate an actual age of the ampoule or a number of iterations of the etch process that have been performed with the ampoule. As another example, the current etch process parameters may include information related to one or more types of materials that will be utilized in the iteration of the etch process. As another example, the current etch process parameters may include information related to a phase of one or more materials that will be utilized in the iteration of the etch process. As another example, the current etch process parameters may include information related to lengths of plumbing fixtures to be used to carry fluids or materials into the etch chamber of the etch tool 108.

In some implementations, the current etch process parameters may include information related to a target wafer or semiconductor device to be etched in the iteration of the etch process. For example, the current etch process parameters may include information related to an effective exposed plain area of the wafer or semiconductor device, information related to an exposed effective plain area crystal orientation of the wafer or semiconductor device, an exposed effective plain area roughness index of the wafer or semiconductor device, an exposed effective sidewall area of the wafer or semiconductor device, or an exposed effective side wall tilt angle of the wafer or semiconductor device, among other examples. As another example, the current etch process parameters may include information related to wafer rotation or tilt parameters associated with the semiconductor wafer or semiconductor device.

In some implementations, the current etch process parameters may include parameters associated with a fluid to be used to process the wafer or semiconductor device in association with performing the etch. In this way, the current etch process parameters may include fixed conditions for the iteration of the etch process for one or more phases or stages of the iteration of the etch process. In general, these fixed conditions may include one or more etch process parameters of the same or similar types as those included in the historical etch process parameters described above.

Further, in some implementations, the current etch process parameters may include a temperature within the etch chamber of the etch tool 108, a pressure within the etch chamber of the etch tool 108, a humidity within the etch chamber of the etch tool 108, or another type of environmental information.

In some implementations, the analysis model 804 utilizes the current etch process parameters and target etch characteristics to determine adjusted etch process parameters. The adjusted etch process parameters identify process parameters that should be utilized for the upcoming iteration of the etch process based on the current etch process parameters and the target etch characteristics. The adjusted etch process parameters correspond to conditions or parameters that can be modified, changed, or adjusted for the upcoming iteration of the iteration of the etch process. Examples of parameters or conditions that may be adjusted include a temperature within the etch chamber, a pressure within the etch chamber, or a time duration of the iteration of the etch process. Generally, the adjusted etch process parameters can include any parameter or condition that can be (dynamically) adjusted between iterations of the etch process. In some implementations, the analysis model 804 may determine the adjusted etch process parameters that is predicted to result in an etch that matches the target etch characteristics. In some implementations, the target etch characteristics may include, for example, a target etch depth after the iteration of the etch process, a target etch depth at one or more intermediate stages or phases of the iteration of the etch process, a target etch area or size, a target etch uniformity, or a target for another characteristic of an etch resulting from an iteration of the etch process.

In some implementations, the analysis model 804 determines the adjusted etch process parameters by providing the current etch process parameters as an input to the analysis model 804. The analysis model 804 then selects trial adjusted etch process parameters corresponding to etch process parameters that can be adjusted for the iteration of the iteration of the etch process. The analysis model 804 then generates predicted etch characteristics based on the current etch process parameters and the trial adjusted etch process parameters. As described above, the predicted etch characteristics may include a predicted etch depth after the iteration of the etch process, a predicted etch depth at one or more intermediate stages or phases of the iteration of the etch process, a predicted etch area or size, or a predicted etch uniformity, or a prediction for another characteristic of an etch predicted to result from an iteration of the etch process performed based on the current etch process parameters and the trial adjusted process conditions data. Here, if the predicted etch characteristics match (e.g., is within an error tolerance of) the target etch characteristics, then the analysis model 804 can generate adjusted etch process parameters specifying values for the adjusted etch process parameters. The specified values can then be utilized for the upcoming iteration of the etch process. Conversely, if the predicted etch characteristics do not match the target etch characteristics, then the analysis model 804 selects other trial values for the adjusted etch process parameters and generates predicted etch characteristics based on the other trial values for the adjusted etch process parameters. This process is repeated until values for the adjusted etch process parameters are found that result in predicted etch characteristics that match the target etch characteristics.

In some implementations, because the analysis model 804 has been trained with a machine learning process that trains the analysis model 804 to generate predicted etch characteristics based on etch process parameters, the analysis model 804 is able to identify adjusted etch process parameters that will result in an etch having characteristics that match the target etch characteristics. In some implementations, the analysis model 804 may be utilized between runs of the etch process or between cycles the etch process to determine adjusted etch process parameters, an example of which is described below with respect to FIGS. 9A and 9B.

The number and arrangement of components shown in FIG. 8 are provided as an example. Controller 802 may include additional components, fewer components, different components, or differently arranged components than those shown in FIG. 8. Additionally, or alternatively, a set of components (e.g., one or more components) of controller 802 may perform one or more functions described as being performed by another set of components of controller 802.

Figure 9A:
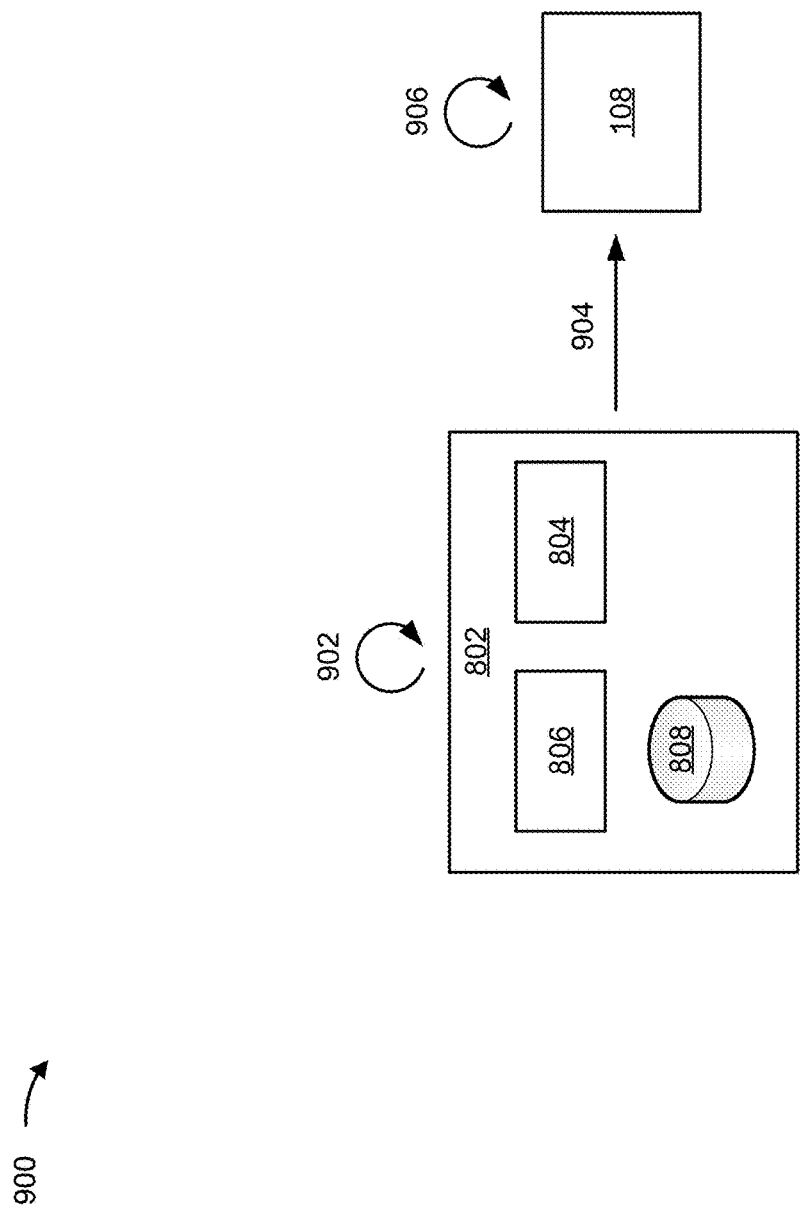
FIGS. 9A and 9B are diagrams of an example implementation described herein.
Figure 9B:
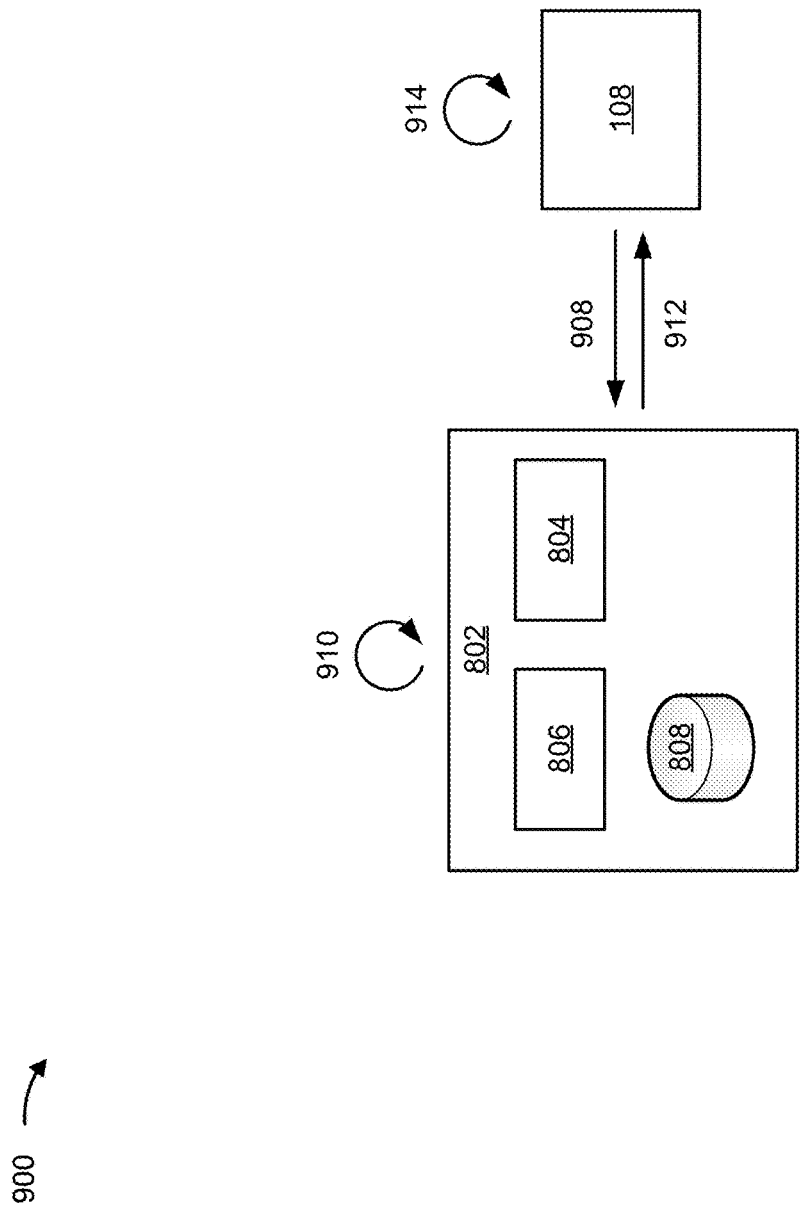

FIGS. 9A and 9B illustrate an example implementation 900 of the controller 802 determining, using the analysis model 804, adjusted etch process parameters to be used by the etch tool 108 for performing an iteration of an etch process (e.g., an ALE process).

As shown in FIG. 9A, and by reference 902, the controller 802 may determine adjusted etch process parameters to be used by the etch tool 108 to perform an iteration of an etch process on a semiconductor device (e.g., the semiconductor device 200, the semiconductor device 400). In some implementations, the etch process may be an ALE process.

In some implementations, the adjusted etch process parameters identify process parameters to be utilized for the iteration of the etch process based on current etch process parameters and the target etch characteristics. As described above, the adjusted etch process parameters correspond to conditions or parameters that can be modified, changed, or adjusted for the upcoming iteration of the etch process. Examples of parameters or conditions that may be adjusted include a temperature within the etch chamber, a pressure within the etch chamber, or a time duration of the iteration of the iteration of the etch process, among other examples. Generally, the adjusted etch process parameters can include any parameter or condition that can be (dynamically) adjusted between iterations of the etch process.

In some implementations, the controller 802 may determine the adjusted etch process parameters using the analysis model 804. The analysis model 804 may include a model trained to determine adjusted etch process parameters based on target etch characteristics for an etch resulting from the iteration of the etch process. In some implementations, the target etch characteristics may include, for example, a target etch depth after the iteration of the etch process, a target etch depth at one or more intermediate stages or phases of the iteration of the etch process, a target etch area or size, a target etch uniformity, or a target for another characteristic of the etch resulting from an iteration of the etch process.

In some implementations, to determine the adjusted etch process parameters, the controller 802 may generate predicted etch characteristics based on trial adjusted etch process parameters. In some implementations, the controller 802 may generate the predicted etch characteristics by providing the trial adjusted etch process parameters as an input to the analysis model 804 and receiving the predicted etch characteristics as an output of the analysis model 804. In some implementations, the analysis model 804 may select the trial adjusted etch process parameters based on, for example, a set of configured (e.g., default) parameter values, a set of previously used values (e.g., used for a most recent iteration of the etch process), or another set of data. Next, the controller 802 may determine whether the predicted etch characteristics match (e.g., are within an error tolerance of) the target etch characteristics. Here, if the predicted etch characteristics match the target etch characteristics, then the controller 802 may utilize the trial adjusted etch process parameters as the adjusted etch process parameters. Conversely, if the predicted etch characteristics do not match the target etch characteristics, then the controller 802 may modify the trial adjusted etch process parameters (e.g., based on one or more particular trial adjusted etch process parameters did not match corresponding target etch characteristics, based on a degree to which the one or more particular trial adjusted etch process parameters did not match the corresponding target etch characteristics, or the like) to obtain modified trial adjusted etch process parameters. The controller 802 may then provide the modified trial adjusted etch process parameters as an input to the analysis model 804 and receive modified predicted etch characteristics as an output of the analysis model 804. The controller 802 may then determine whether the modified predicted etch characteristics match the target etch characteristic. The controller 802 may repeat these steps until the analysis model 804 provides predicted etch characteristics that match the target etch characteristics.

As shown in FIG. 9A, and by reference 904, the controller 802 may provide the adjusted etch process parameters to the etch tool 108 to permit the etch tool 108 to perform the iteration of the etch process according to the adjusted etch process parameters. As shown by reference 906, the etch tool 108 may receive the adjusted etch process parameters and may perform the iteration of the etch process according to the adjusted etch process parameters.

As shown in FIG. 9B, and by reference 908, the controller 802 may determine actual etch characteristics associated with the iteration of the etch process. For example, after the etch tool 108 performs the etch, the controller 802 may determine actual etch characteristics that include characteristics of the etch as actually performed by the etch tool 108 according to the adjusted set of etch process parameters. In some implementations, the controller 802 may determine the actual etch characteristics based on receiving the actual etch characteristics from the etch tool 108 or another device configured to determine the actual etch characteristics. In some implementations, the actual etch characteristics may be obtained, for example, using one or more sensors configured on, in, or near the etch tool 108.

As shown by reference 910, the controller 802 may update the analysis model 804 based on the actual etch characteristics. For example, the controller 802 may receive the actual etch characteristics and may further train the analysis model 804 using the actual etch characteristic (now considered historical actual etch characteristic) and etch process parameters associated with the iteration of the etch process (now considered historical etch process parameters). In this way, the controller 802 may update the analysis model 804 to obtain an updated analysis model 804 that can be used to determine adjusted etch process parameters to be used by the etch tool 108 to perform another iteration of the etch process, which improves operation of the analysis model 804.

In some implementations, as shown by references 912 and 914, the controller 802 may determine, using the updated analysis model 804, adjusted etch process parameters for another iteration of the etch process (e.g., using the analysis model 804 in the manner described above), and may provide the adjusted etch process parameters to the etch tool 108 to permit the etch tool 108 to perform the other iteration of the etch process according to the adjusted etch process parameters. In this way, the controller 802 may determine adjusted etch process parameters on a cycle-to-cycle basis (e.g., the controller 802 may determine adjusted etch process parameters for each cycle of the etch process performed on a given wafer or semiconductor device) or on a run-to-run basis (e.g., the controller 802 may determine adjusted etch process parameters for each run of the etch process performed on different wafers or semiconductor devices).

As indicated above, FIGS. 9A and 9B are provided as an example. Other examples may differ from what is described with regard to FIGS. 9A and 9B.

Figure 10:
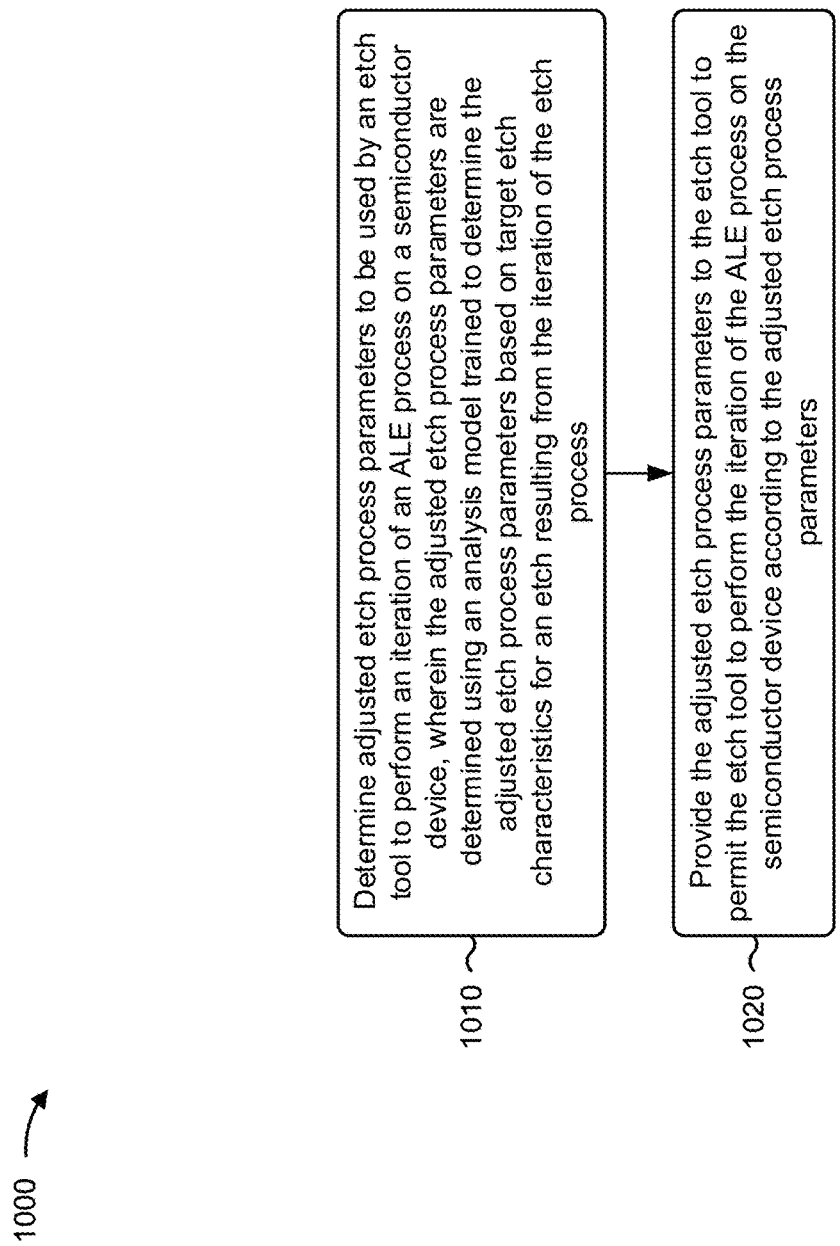
FIG. 10 is a flowchart of an example process relating to performing an iteration of an etch process described herein.

FIG. 10 is a flowchart of an example process 1000 relating to determining adjusted etch process parameters to be performing an etch process described herein. In some implementations, one or more process blocks of FIG. 10 may be performed by a controller (e.g., controller 802). In some implementations, one or more process blocks of FIG. 10 may be performed by another device or a group of devices separate from or including the controller, such as by one or more components of etch tool 108. Additionally, or alternatively, one or more process blocks of FIG. 10 may be performed by one or more components of device 600, such as processor 620, memory 630, storage component 640, input component 650, output component 660, and/or communication component 670.

As shown in FIG. 10, process 1000 may include determining adjusted etch process parameters to be used by an etch tool to perform an iteration of an ALE process on a semiconductor device (block 1010). For example, the controller may determine adjusted etch process parameters to be used by an etch tool (e.g., the etch tool 108) to perform an iteration of an ALE process on a semiconductor device (e.g., the semiconductor device 200, the semiconductor device 400), as described above. In some implementations, the adjusted etch process parameters are determined using an analysis model (e.g., the analysis model 804) trained to determine the adjusted etch process parameters based on target etch characteristics for an etch resulting from the iteration of the ALE process.

As further shown in FIG. 10, process 1000 may include providing the adjusted etch process parameters to the etch tool to permit the etch tool to perform the iteration of the ALE process on the semiconductor device according to the adjusted etch process parameters (block 1020). For example, the controller may provide the adjusted etch process parameters to the etch tool to permit the etch tool to perform the iteration of the ALE process on the semiconductor device according to the adjusted etch process parameters, as described above.

Process 1000 may include additional implementations, such as any single implementation or any combination of implementations described below and/or in connection with one or more other processes described elsewhere herein.

In a first implementation, determining the adjusted etch process parameters comprises generating predicted etch characteristics based on trial adjusted etch process parameters, the predicted etch characteristics being generated by providing the trial adjusted etch process parameters as an input to the analysis model, determining whether the predicted etch characteristics match the target etch characteristics, and determining the adjusted etch process parameters based on whether the predicted etch characteristics match the target etch characteristics.

In a second implementation, alone or in combination with the first implementation, the iteration of the ALE process is a first iteration, and the method further comprises determining actual etch characteristics associated with the iteration of the ALE process after the iteration of the ALE process is performed according to the adjusted etch process parameters, and updating the analysis model based on the actual etch characteristics, a result of updating the analysis model being an updated analysis model, wherein the updated analysis model is to be used to determine adjusted etch process parameters to be used by the etch tool to perform a second iteration of the ALE process.

In a third implementation, alone or in combination with one or more of the first and second implementations, the first iteration of the ALE process and the second iteration of the ALE process are a first cycle of the etch process and a second cycle of the ALE process, respectively.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

In this way, the multi-silicide structure 226 described herein has an increased thickness (e.g., as compared to a contact silicide including a single, non-conformal silicide layer), and/or is formed to include conformal silicide layers. The increased thickness and conformal nature of the multi-silicide structure 226 reduces contact resistance in the semiconductor device 200/400, thereby improving performance and increasing manufacturing yield.

Further, the dynamic adjustment of the etch process parameters for the etch tool 108 determined using the analysis model 804 enables etching (e.g., ALE) with improved reliability. That is, the dynamic adjustment of the etch process parameters enables etching that reliably matches target specifications, thereby enabling reliable performance of semiconductor devices and improving manufacturing yield.

As described in greater detail above, some implementations described herein provide a semiconductor device. The semiconductor device includes a multi-silicide structure comprising at least two conformal silicide layers, the multi-silicide structure including, a first conformal silicide layer on a source/drain, a second conformal silicide layer on the first conformal silicide layer, and a capping layer over the second conformal silicide layer. The semiconductor device includes a contact structure on the multi-silicide structure. The semiconductor device includes a dielectric material around the contact structure.

As described in greater detail above, some implementations described herein provide a method. The method includes etching a recess in a dielectric material over a source/drain of a semiconductor device. The method includes forming a multi-silicide structure in the recess, where forming the multi-silicide structure comprises, forming a first conformal silicide layer on a bottom surface of the recess, forming a second conformal silicide layer on the first conformal silicide layer, and forming a capping layer over the second conformal silicide layer. The method includes forming a contact structure on the multi-silicide structure within the recess.

As described in greater detail above, some implementations described herein provide a method. The method includes determining, by a controller, adjusted etch process parameters to be used by an etch tool to perform an iteration of an atomic layer etch (ALE) process on a semiconductor device, where the adjusted etch process parameters are determined using an analysis model trained to determine the adjusted etch process parameters based on target etch characteristics for an etch resulting from the iteration of the ALE process. The method includes providing, by the controller, the adjusted etch process parameters to the etch tool to permit the etch tool to perform the iteration of the ALE process on the semiconductor device according to the adjusted etch process parameters.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a multi-silicide structure comprising:
  a first conformal silicide layer on a source/drain,
  a second conformal silicide layer on the first conformal silicide layer, wherein the second conformal silicide layer is entirely above the source/drain, and
  a capping layer covering an entire surface of the second conformal silicide layer,
 the capping layer being a metal layer or a metal compound layer;
 a contact structure covering an entire surface of the multi-silicide structure; and
 a dielectric material around the contact structure.

2. The semiconductor device of claim 1, wherein a ratio of metal to silicon in the first conformal silicide layer is greater than 1.

3. The semiconductor device of claim 1, wherein a ratio of silicon to metal in the second conformal silicide layer is greater than 1.

4. The semiconductor device of claim 1, wherein a total thickness of the first conformal silicide layer and the second conformal silicide layer is at least approximately 20 angstroms.

5. The semiconductor device of claim 1, wherein a thickness of each of the first conformal silicide layer and the second conformal silicide layer is in a range from approximately 5 angstroms to approximately 10 angstroms.

6. The semiconductor device of claim 1, wherein at least one of the first conformal silicide layer or the second conformal silicide layer comprises at least one of nickel silicide, cobalt silicide, titanium silicide, or tantalum silicide.

7. The semiconductor device of claim 1, wherein the multi-silicide structure includes a third conformal silicide layer on the second conformal silicide layer and a fourth conformal silicide layer on the third conformal silicide layer,
wherein a ratio of metal to silicon in the third conformal silicide layer is greater than 1 and a ratio of silicon to metal in the fourth conformal silicide layer is greater than 1.

8. The semiconductor device of claim 1, wherein the metal compound layer is a metal nitride, a metal oxide, or a transparent metal oxide.

9. The semiconductor device of claim 1, wherein the dielectric material around the contact structure is doped with an enhancement element associated with sealing the contact structure.

10. The semiconductor device of claim 1, wherein the semiconductor device is a three-dimensional (3D) gate-all-around (GAA) metal-oxide-semiconductor field-effect transistor (MOSFET).

11. A method, comprising:
etching a recess in a dielectric material over a source/drain of a semiconductor device;
forming a multi-silicide structure in the recess, where forming the multi-silicide structure comprises:
forming a first conformal silicide layer on a bottom surface of the recess,
forming a second conformal silicide layer on the first conformal silicide layer, wherein the second conformal silicide layer is entirely above the source/drain, and
forming a capping layer covering an entire surface of the second conformal silicide layer, the capping layer being a metal layer or a metal compound layer; and
forming a contact structure covering an entire surface of the multi-silicide structure within the recess.

12. The method of claim 11, further comprising performing a pre-clean in the recess prior to forming the multi-silicide structure in the recess to remove a native oxide from at least the bottom surface of the recess.

13. The method of claim 11, wherein forming the first conformal silicide layer comprises depositing a metal material on the bottom surface of the recess using a chemical vapor deposition (CVD) process.

14. The method of claim 11, wherein forming the second conformal silicide layer comprises growing the second conformal silicide layer on the first conformal silicide layer using a soaking process.

15. The method of claim 11, wherein forming the capping layer comprises:
forming a capping layer material over the second conformal silicide layer and on one or more sidewalls of the recess, and
etching the capping layer material from the one or more sidewalls of the recess.

16. The method of claim 15, wherein the capping layer material is etched from the one or more sidewalls of the recess using an atomic layer etching (ALE) process, wherein a set of etch process parameters used for the ALE process was determined using an analysis model configured to determine sets of etch process parameters.

17. A semiconductor device, comprising:
a multi-silicide structure comprising:
a first conformal silicide layer;
a second conformal silicide layer on the first conformal silicide layer, wherein the second conformal silicide layer is entirely above a source/drain; and
a capping layer covering an entire surface of the second conformal silicide layer; and
a contact structure covering an entire surface of the multi-silicide structure.

18. The semiconductor device of claim 17, wherein a ratio of metal to silicon in the first conformal silicide layer is greater than 1.

19. The semiconductor device of claim 17, wherein a ratio of silicon to metal in the second conformal silicide layer is greater than 1.

20. The semiconductor device of claim 17, wherein a thickness of each of the first conformal silicide layer and the second conformal silicide layer is in a range from approximately 5 angstroms to approximately 10 angstroms.

* * * * *